US006864039B2

(12) United States Patent
Cheng et al.

(10) Patent No.: US 6,864,039 B2
(45) Date of Patent: Mar. 8, 2005

(54) PHOTOBLEACHABLE COMPOUNDS FOR USE IN FLEXOGRAPHIC PRINTING PLATES

(75) Inventors: Lap Kin Cheng, Bear, DE (US); Lap-Tak Andrew Cheng, Newark, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 8 days.

(21) Appl. No.: 10/413,853

(22) Filed: Apr. 15, 2003

(65) Prior Publication Data

US 2003/0219681 A1 Nov. 27, 2003

Related U.S. Application Data

(63) Continuation of application No. 09/619,052, filed on Jul. 18, 2000, now abandoned.
(60) Provisional application No. 60/169,437, filed on Dec. 7, 1999.

(51) Int. Cl.[7] .......................... G03C 8/00; G03F 7/095; G03F 7/30
(52) U.S. Cl. ............................. 430/273.1; 430/286.1; 430/287.1; 430/138; 430/281.1; 430/292; 430/306; 430/944
(58) Field of Search .................... 430/286.1, 287.1, 430/138, 281.1, 292, 306, 273.1, 944

(56) References Cited

U.S. PATENT DOCUMENTS

| | | | |
|---|---|---|---|
| 3,996,215 A | | 12/1976 | Kobayashi |
| 4,251,619 A | | 2/1981 | Kurita |
| 4,394,437 A | | 7/1983 | Bergendahl |
| 4,427,759 A | | 1/1984 | Gruetzmacher et al. |
| 4,455,368 A | * | 6/1984 | Kojima et al. .............. 430/507 |
| 4,460,675 A | | 7/1984 | Gruetzmacher |
| 4,578,344 A | | 3/1986 | Griffing |
| 4,661,433 A | | 4/1987 | Davis |
| 4,705,729 A | | 11/1987 | Sheats |
| 4,889,795 A | | 12/1989 | Kaifu |
| 5,015,556 A | | 5/1991 | Martens |
| 5,039,592 A | | 8/1991 | Umeda |
| 5,049,478 A | | 9/1991 | Koch |
| 5,091,280 A | * | 2/1992 | Yamaguchi et al. ........ 430/138 |
| 5,153,105 A | | 10/1992 | Sher |
| 5,506,086 A | | 4/1996 | Van Zoeren |
| 5,719,009 A | | 2/1998 | Fan |

FOREIGN PATENT DOCUMENTS

| | | |
|---|---|---|
| EP | 0084851 B2 | 7/1993 |
| EP | 0225676 B1 | 7/1994 |
| JP | 62287234 | 12/1987 |
| JP | 63121039 | 5/1988 |

OTHER PUBLICATIONS

Dupont Cyrel Now flexographic plates, copyright 200 E.I. duPont de Nemours and COmpany, three pages from http://www.cyrel.dupont.com site on internet.*

Galiazzo, Guido, et al., Synthesis, Electronic Spectra, and Photoisomerization of Naphthylpyridylethylenes, *J.C.S. Perkin II*, 1712–1715, 1975.

Galiazzo, Guido, et al., Synthesis and Photochemical Behaviour of N–Styryolquinolines and N–Styrylisoquinolines, *Gazzetta Chimica Italiana*, 120, 581–585, 1990.

Stegrist, A. E., et al., Preparation of Styryl Derivatives From Methyl–Substituted Carbocyclic Aromatics, *Helvetica Chimica Acta*, 52, Part 8, 2521–2554, 1969.

Shaw, B. D., et al., The Reaction Between 2–Picoline and Aromatic Aldehydes, *J. Chem. Soc.*, 77–79, 1933.

Cozzari, C., et al., Synthesis of a Naphthylvinylpyridine Derivative and its use for Affinity Chromatography of Choline Acetyltransferase, *Analytical Biochemistry*, 133, 120–125, 1983.

West, Paul R., et al., Contrast Enhancement—A Route to Submicron Optical Lithography, *Proceedings SPIE*, 394, 33–38, 1983.

Borden, Douglas G., et al., Photopolymer Design: Photocrosslinkable Styrylpyridinium Substituted Vinyl Polymers With Absorption Maxima From 270 NM to 540 NM, *Makromol Chem.*, 178, 3035–3049, 1977.

Hamer, J., et al., Nitrones, *Chem. Reviews*, 64, No. 4, 473–495, 1964.

Loader, C. E., et al., Studies in Photochemistry. Part VI. The Photocyclodehydrogenation of Some Styrylquinolines and Styrylisoquinolines, *J. Chem. Soc.*, C, 330–333, 1968.

Yonezawa, T., et al., Water–Soluble Contrast Enhancing Materials—New Photobleachable Dyes, *Polymer Engineering and Science*, 29, No. 14, 898–901, 1989.

Mitchell, Earl N., Photographic Science, *John Wiley & Sons*, 168–169, 1984.

(List continued on next page.)

*Primary Examiner*—Cynthia Hamilton

(57) ABSTRACT

A photosensitive printing element comprising a support; and a photopolymerizable layer comprising a photopolymerizable composition comprising at least one elastomeric binder, at least one monomer, an initiator having sensitivity to actinic radiation, and at least one photobleachable compound having sensitivity to actinic radiation; is described. Preferred photobleachable compounds are unsubstituted or substituted naphthylvinyl pyridines; unsubstituted or substituted styrylquinolines; diphenyl maleic anhydride; isomers of any of the foregoing; derivatives of any of the foregoing; and any combination of the foregoing. Such photosensitive printing elements are used to prepare flexographic printing plates and are useful in enhancing resolution and differentiating image areas from non-image areas in images produced therefrom by reducing the deleterious effect of scattered light.

34 Claims, 5 Drawing Sheets

OTHER PUBLICATIONS

Strom, Don R., Optical Lithography and Contrast Enhancement, *Semiconductor International*, May 1986.
Griffing, B. F., et al., Contrast Enhanced Photoresists—Processing and Modeling, *Polymer Engineering and Science*, 23, No. 17, 947–952, 1983.
Ichimura, K., Photochromic Materials and Photoresists, *Photochromism*, 903–918, 1990.
XP002162199, Nippon Paint Co. Ltd., Dec. 14, 1987.
Umeda, 110: 145011, CA, ACS copyright, English Abstract of JP62–287234, 2 pages.
Umeda, JP62–287234A, Copyright JPU & Japio, 1987, English Abstract of JP62–287234, 2 pages.
Umeda, 1988–025851, Derwent Information Ltd., Copyright 1999, English Abstract of JP62–287234, 3 pages.

* cited by examiner

PHOTOBLEACHABLE COMPOUNDS FOR USE IN FLEXOGRAPHIC PRINTING PLATES

FIELD OF THE INVENTION

This invention relates to the use of photobleachable compounds in flexographic printing plates. Image resolution is improved by reducing halation without substantial sacrifice in photospeed.

TECHNICAL BACKGROUND

Flexographic printing plates are widely used for printing of packaging materials ranging from corrugated carton boxes to cardboxes and to continuous web of plastic films. These plates are made from photosensitive material such as photocrosslinkable monomer-binder-initiator compositions and are sandwiched between polyester (e.g., Mylar® film) support sheets. Flexographic printing plates are characterized by their ability to crosslink or cure upon exposure to actinic radiation. Exposure and development of these plates typically consist of a uniform exposure of the back-side of the plate to a specified amount of actinic radiation. Next, an image-wise exposure of the front-side of the plate is made through an image-bearing art-work or a template, such as a photographic negative or transparency, e.g. silver halide films. The plate is exposed to actinic radiation, such as an ultraviolet (UV) or black light. The actinic radiation enters the photosensitive material through the clear areas of the transparency and is blocked from entering the black or opaque areas. The exposed material crosslinks and becomes insoluble to solvents used during image development. The unexposed, uncross-linked photopolymer areas under the opaque regions of the transparency remain soluble and are washed away with a suitable solvent leaving a relief image suitable for printing. Then the plate is dried. The printing plate can be further treated to remove surface tackiness. After all desired processing steps, the plate is mounted on a cylinder and used for printing.

For printing, surface quality and properties of a flexographic printing plate are important attributes. In practice prolonged exposure time is often necessary in order to hold or fully cure the smaller features such as the finer high-light dots, e.g. 1% or 2% dots, wherein % refers to the amount of area of paper covered with print ink, of high quality print images. The term "exposure latitude" describes the degree to which a photosensitive element can be over-exposed with only negligible image quality degradation. Photosensitive flexographic printing plates with larger exposure latitude are desirable as they are more tolerant to the actual exposure time used during front image-wise exposure, and are thus easier to use in practice.

One problem associated with flexographic printing plates is halation caused by the scattering of UV light within the non-image areas of the photopolymerizable medium. As nearly all heterogeneous photocrosslinkable compositions exhibit some degree of light scattering, prolonged image-wise exposure leads to a high level of background scattered actinic radiation, which is often sufficient to cause cross-linking or curing of polymer in regions not exposed to image-wise radiation. The overall effect of such unwanted cross-linking is the filling-in of fine negative, i.e., non-image, relief features and formation of broad shoulders, i.e., "halos", around solid image areas. These lead to degradation in the print quality of flexographic printing plates and are linked to dot-gain which is the formation of a larger image dot size than intended.

Halation also degrades print-image quality by reducing plate exposure latitude. This problem is particularly pronounced in newly extruded plates. Exposure latitude can be further defined as the ability to simultaneously image low light throughput features, e.g., 1–2% dots, and high light throughput features, e.g., 4 mils reverse lines, onto a flexographic plate. To achieve wider exposure latitude and more stable properties, it is currently necessary to age-in newly extruded plates by storing them for 4–6 weeks. It is believed that during this age-in period, low levels of oxygen diffuse into the plate, and inhibit low level polymerization. Reducing or eliminating this "age-in" period would result in significant savings in inventory cost and shorten product cycle time.

Contributing to halation problems are capping layers which are sometimes added to flexographic printing plates to improve their ink transfer characteristics. Such capping layers may scatter actinic radiation very differently from the bulk of the printing plate, and due to its close proximity to the critical printing surface, minute differences in the refractive indices between the capping layer and the bulk can lead to unwanted photopolymerization of the critical printing surface. In addition, depending on the polymer composition, as much as 90% of scattered UV can originate from the top 25% of a photopolymerization layer.

Another problem with flexographic printing plates is contrast degradation caused by the graininess of image-bearing art-work. Most commercial image-bearing artworks are based on silver halides emulsion technology. As such, the graininess of silver halide particles often leads to a microscopically fuzzy image edge across the opaque and transmissive area of the art-work. This fuzzy image edge is partially transmissive for actinic radiation and thus can degrade image definition when the image is photochemically transferred from the artwork to the flexographic printing plate. The prolonged imagewise exposure needed for flexographic printing plates often leads to dot-gain. This problem is particularly pronounced in small (<1%) print dots, where the cross sectional area spanned by the fuzzy image edge is comparable to that of the print dots.

Another problem with flexographic printing plates is their thickness. Thinner plates are desired because they would make processing shorter, require less drying time, require less polymer and therefore would be cheaper. Deep relief would be needed to enhance imaging in such thin plates. It is generally more difficult to achieve high image quality in a thin plate construction. There are several reasons for this: 1) a thin plate requires more accurate control of the image relief depth, e.g. uncontrolled variation of relief depth across a printing plate can result in poor print image transfer; 2) the quality of relief image typically deteriorates, e.g., more "halo" develops, as the image relief depth decreases; and 3) the specular reflections of actinic radiation from the surfaces of a polyester support, and of a glass plate of an exposure unit can cause unwanted photopolymerization in the non-image areas of the photosensitive element.

A traditional approach to mitigate the effect of scattered actinic radiation is to increase the absorptivity of the polymeric medium such that scattered radiation is attenuated more efficiently. In one approach, passive UV absorbing dye is added to the flexographic printing plate formulation to increase absorptivity. While effective, this approach suffers from excessive loss in photospeed, as a proportional amount of radiation is siphoned off by the passive dye absorber. In another approach, higher photoinitiator concentration is used to raise the medium's absorptivity. While also effective, this approach too has shortcomings. The higher photoinitiator concentration renders the unexposed regions more sensitive to scattered actinic radiation, partly reversing the benefit gained from higher absorptivity.

Various passive non-bleaching dyes have been used as antihalation agents in color photography applications, and certain styryl and butadienyl dyes capable of being decolorized have also been proposed for use as antihalation agents in color photography (see U.S. Pat. No. 3,996,215). However, the azo-linkage of such dyes is too thermally unstable and readily undergoes trans→cis conversion at high temperature, i.e., thermal bleaching. This thermally induced absorptivity bleaching makes these azo-dyes unsuitable for melt-extruded flexographic printing plate application. In addition, photography applications involve the use of thin films where bulk light propagation effect and issues relating to volume through-cure are less important.

Certain styrylpyridinium compounds have been used as photobleachable dyes in water-soluble contrast enhancement layers (CEL) for photolithography for electronic devices (see Yonezawa, et al., *Polym. Eng. Sci.*(1989), 29 (14), pp. 898–901, and Japanese Pat. Appl. No. 63-121039 (1989)). Such systems typically consist of a layer of photoresist on top of a silicon wafer with the CEL covering the photoresist. The CEL contains a photobleachable dye, and the unbleached portion of the CEL acts in situ as a contact mask during exposure. Yonezawa et al. describe water-soluble contrast enhancement material composed of certain styrylpyridinium compounds and certain water-soluble polymer which showed thermal stability and photobleaching properties.

In U.S. Pat. No. 4,661,433 aryl nitrones are described as useful as photobleachable compounds in photolithography techniques for contrast enhancement. However, these dyes can be incompatible with unsaturated vinylic monomers or binders as they react readily with such monomers and binders at high temperature (about 120° C.) (see Hamer et al., *Chemical Reviews,* (1964), 64(4) pp. 474–498). In addition, the aryl-nitrone dyes are moisture sensitive leading to storage stability issues.

There is a need for a method of enhancing desirable flexographic printing plate properties, such as improved resistance to scattered light and wider exposure latitude, leading to higher image resolution in prints made by such plates. There is also a need for a method for providing images with a desired differentiation between image and non-image areas and a need to reduce or eliminate the age-in period for newly formed flexographic printing plates. There is further need for thinner flexographic printing plates.

SUMMARY OF THE INVENTION

The present invention concerns a photopolymerizable composition comprising at least one elastomeric binder, at least one monomer, an initiator having sensitivity to actinic radiation; and at least one photobleachable compound having sensitivity to actinic radiation.

The present invention also concerns a photosensitive printing element used for preparing flexographic printing plates, comprising a support; and a photopolymerizable layer comprising the photopolymerizable composition described above.

The present invention further concerns a method of preparing a photosensitive printing element used for preparing flexographic printing plates, comprising the steps of: applying the photopolymerizable composition described above to a support to form a photopolymerizable layer thereon.

The present invention also concerns a method for making a flexographic printing plate comprising the steps of (a) imagewise exposing the photosensitive printing element described above to actinic radiation to selectively polymerize portions of the photopolymerizable layer; and (b) treating the element resulting from step (a) to remove unpolymerized portions of the photopolymerizable layer to form a flexographic printing plate.

The present invention also concerns a method of enhancing resolution in images produced from a flexographic printing plate, said flexographic printing plate comprising the photosensitive printing element of the present invention, comprising the step of adding at least one photobleachable compound to the photopolymerizable composition.

DETAILS OF THE INVENTION

Figure 1:
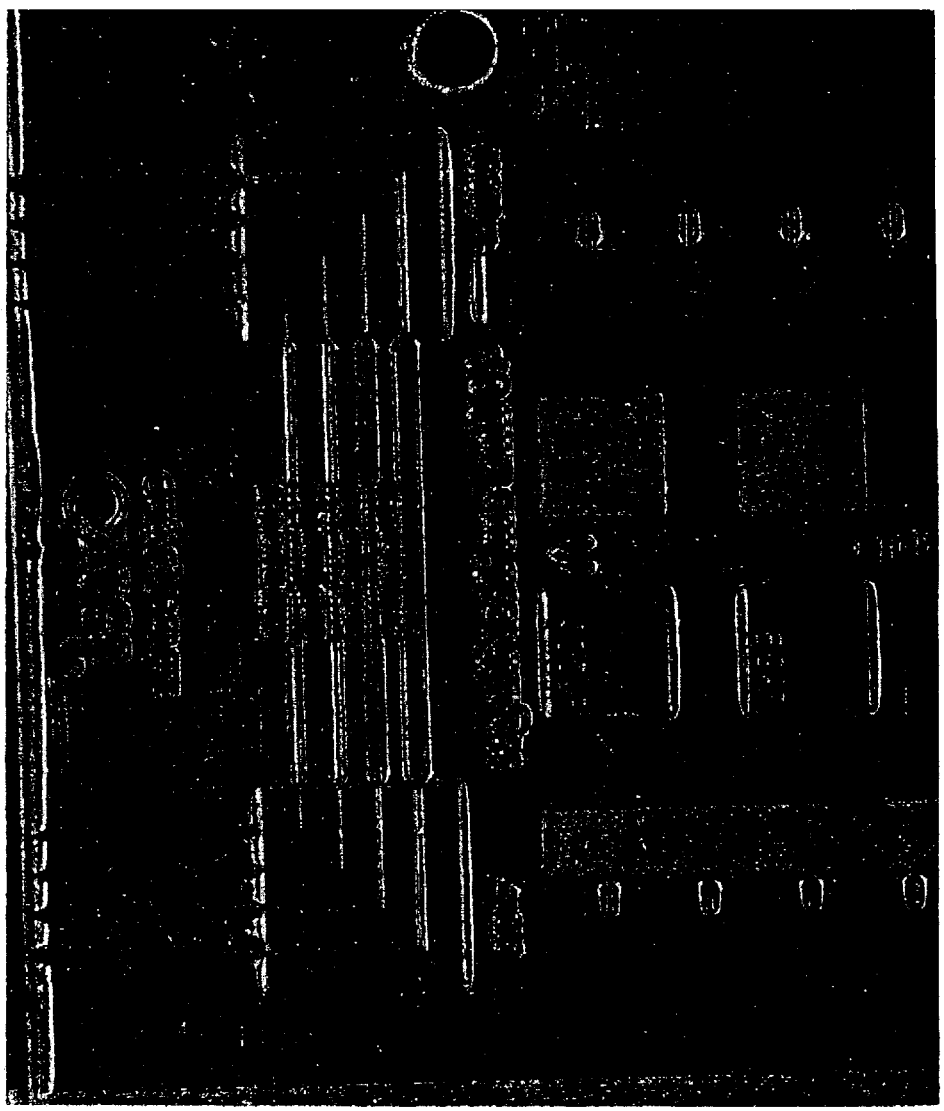
FIG. 1 is a photograph of a flexographic printing plate of Example 1.

The photopolymerizable composition, photosensitive element, processes and methods of the present invention concern the use of a photobleachable compound to enhance desirable properties in flexographic printing plates and the images made therefrom. Such desirable properties include improved resistance to scattered light and wider exposure latitude leading to higher image resolution. The inclusion of the photobleachable compound in photopolymerizable compositions and photosensitive printing elements made using such photopolymerizable compositions assists in effectively differentiating image areas from non-image areas in flexographic printing plates made therefrom by impeding the transmission of actinic radiation into the latter while permitting high light through-put in the image areas.

The photosensitive printing element of the present invention used for preparing flexographic printing plates comprises a support; and a photopolymerizable layer which includes a photopolymerizable composition comprising at least one elastomeric binder, at least one monomer, an initiator having sensitivity to actinic radiation, and at least one photobleachable compound having sensitivity to actinic radiation. The photosensitive printing element may further comprise at least one additional layer which can include at least one barrier layer, a layer of infrared radiation sensitive material referred to herein as an infrared-sensitive layer, or any combination of such barrier and infrared-sensitive layers. Such infrared-sensitive layers are substantially opaque to actinic radiation, and the infrared radiation sensitive material from which it is made is ablatable, upon exposure to infrared laser radiation, from the surface of the photopolymerizable layer or from the surface of the barrier layer, if the barrier layer is applied to the surface of the photopolymerizable layer prior to application of the infrared-sensitive layer.

Unless otherwise indicated, the term "flexographic printing plate or element" encompasses plates or elements in any form suitable for flexographic printing, including, but not limited to, flat sheets and seamless continuous forms.

The support can be any flexible material which is conventionally used with photosensitive printing elements used to prepare flexographic printing plates. Preferably the support is transparent to actinic radiation to accommodate "backflash" exposure through the support. Examples of suitable support materials include polymeric films such as those formed by addition polymers and linear condensation polymers, transparent foams and fabrics. Under certain end-use conditions, metals such as aluminum may also be used as a support, even though a metal support is not transparent to radiation. A preferred support is a polyester film; particularly preferred is a polyethylene terephthalate film. The support can have a thickness from about 2 mils to about 10 mils (about 0.0051 cm to about 0.025 cm), with a preferred thickness of about 3 mils to about 8 mils (about 0.0076 cm to about 0.020 cm).

As used herein, the term "photopolymerizable" encompasses systems which are photopolymerizable, photocrosslinkable, or both. The photopolymerizable layer comprises a photopolymerizable composition which composition comprises at least one elastomeric binder, at least one monomer, an initiator having sensitivity to actinic radiation, and at least one photobleachable compound having sensitivity to actinic radiation. The photopolymerizable layer can be soluble, swellable or dispersible in a developer solution, that is washed out with either solvent or an aqueous based solution (see U.S. Pat. No. 4,423,135 and U.S. Pat. No. 4,369,246), and/or can be capable of partially liquefying upon thermal development, that is, the unpolymerized areas of the photopolymerizable layer soften or melt upon heating to a development temperature (but not be subject to cold flow, i.e., dimensional change, during normal storage).

The elastomeric binder can be a single polymer or a mixture of polymers. The elastomeric binder can be soluble, swellable or dispersible in an aqueous, semi-aqueous or an organic solvent developer. Elastomeric binders which are soluble or dispersible in aqueous or semi-aqueous developers have been disclosed in Alles, U.S. Pat. No. 3,458,311; Pohl, U.S. Pat. No. 4,442,302; Pine, U.S. Pat. No. 4,361,640; Inoue et al., U.S. Pat. No. 3,794,494; Proskow, U.S. Pat. No. 4,177,074; Proskow, U.S. Pat. No. 4,431,723; Worns, U.S. Pat. No. 4,517,279, Suzuki et al., U.S. Pat. No. 5,679,485; Suzuki et al., U.S. Pat. No. 5,830,621; and Sakurai et al., U.S. Pat. No. 5,863,704. Elastomeric binders which are soluble, swellable or dispersible in organic solvent developers include natural or synthetic polymers of conjugated diolefin hydrocarbons, including polyisoprene, 1,2-polybutadiene, 1,2-polybutadiene, butadiene/acrylonitrile, butadiene/styrene thermoplastic-elastomeric block copolymers and other copolymers. The block copolymers discussed in Chen, U.S. Pat. No. 4,323,636; Heinz et al., U.S. Pat. No. 4,430,417; and Toda et al., U.S. Pat. No. 4,045,231 can be used. The elastomeric binders which are suitable for use in aqueous, semi-aqueous or organic developers are generally also suitable for use in thermal developing to soften or melt unpolymerized areas of the photopolymerizable layer upon heating. It is preferred that the elastomeric binder be present in at least an amount of 65% by weight of the photopolymerizable layer. Preferred elastomeric binders include styrene-butadiene-styrene block copolymers and styrene-isoprene-styrene block copolymers.

The term "elastomeric binder", as used herein, further encompasses core shell microgels and blends of microgels and preformed macromolecular polymers, such as those disclosed in Fryd et al., U.S. Pat. No. 4,956,252 and U.S. Pat. No. 5,707,773.

The photopolymerizable layer can include a single monomer or a mixture of monomers which must be compatible with the elastomeric binder to the extent that a clear, non-cloudy photopolymerizable layer is produced. Monomers suitable for use in photopolymerizable layers are well known in the art. Examples of such monomers can be found in Chen U.S. Pat. No. 4,323,636; Fryd et al., U.S. Pat. No. 4,753,865; Fryd et al., U.S. Pat. No. 4,726,877; and Feinberg et al., U.S. Pat. No. 4,894,315. It is preferred that the monomer be present in at least an amount of 5% by weight of the photopolymerizable layer.

The initiator can be any single compound or a combination of compounds which is sensitive to actinic radiation, generating reactive radicals which initiate the polymerization of the monomer or monomers without excessive termination. The degree of photopolymerization achieved during the period of exposure to actinic radiation should be sufficiently high to impart a solubility difference between the image and non-image areas in the developer solution. Initiators suitable for use in photopolymerizable layers are well known in the art. Most common initiators are thermally stable, visible or UV absorbing and include a substituted and an unsubstituted polynuclear quinone, and various acetophenone derivatives. Examples of suitable systems can be found in Gruetzmacher, U.S. Pat. No. 4,460,675 and Feinberg et al., U.S. Pat. No. 4,894,315, and in commercial photoinitiator literature, e.g., Dietliker, et al., Novel High Performance Bisacylphosphine Oxide (BAPO) Photoinitiators, Product Literature, Additivies Division, Ciba-Geigy Corp., 1994. Initiators are generally present in amounts from 0.001 wt. % to 10.0 wt. % of the photopolymerizable layer with the exact amount generally determined by the desired optical density needed to efficiently capture incident actinic radiation and attenuate unwanted scattered UV. Preferred initiators are 2,2-dimethoxy-2-phenyl acetophenone; 1-hydroxycyclohexyl-phenyl ketone and benzophenone mixture; and 2-benzyl-2-N,N-dimethylamino-1-(4-morpholinophenyl)-1-butanone.

At least one photobleachable compound having sensitivity to actinic radiation is included in the present photopolymerizable composition or the present photopolymerizable layer. The photobleachable compound is capable of absorbing actinic radiation and changing from substantially opaque to substantially transparent. The photobleachable compound bleaches out quickly in the exposed area of the photopolymerizable layer upon exposure to actinic radiation allowing photo-induced cross-linking to proceed as usual, while in the unexposed area, the photobleachable compound keeps the absorptivity high to attenuate out deleterious scattered radiation. Thus, images produced using flexographic printing plates prepared from the present photosensitive printing element which includes the photobleachable compound exhibit better image resolution than those without such a photobleachable compound since, among other reasons, such photosensitive printing elements are capable of holding a finer dot-size.

For the purpose of creating maximum differentiation between image and non-image areas, the photobleaching which occurs within the exposed areas of the photopolymerizable layer upon exposure to actinic radiation is preferably "clean". By "clean" is meant that the residual optical density of the photobleachable compound in its fully photobleached state should be low and thus will not compete with the initiator for the actinic radiation. In essence, the photobleachable compound exhibits characteristics that allow it to function as an effective "light-gate". By "light-gate" is meant that the photobleachable compound can be effective in channeling actinic radiation energy away from the radical-generating initiator in the non-image areas, while becoming substantially transparent to actinic radiation in the image areas.

Inclusion of the photobleachable compound also provides enhancement of the intensity contrast across the fuzzy image edge between the bright and the dark area of the artwork. This increases the intensity gradient beneath the fuzzy image edge, making the increase in dot-gain with image-wise exposure time more gradual. Flexographic printing plates prepared using the photosensitive printing elements of the present invention comprising the at least one photobleachable compound can be exposed to actinic radiation for longer duration than those without a photobleachable compound without suffering a serious dot-gain problem. The longer duration of exposure provided by inclusion of the at least one photobleachable compound improves image resolution.

To avoid an excessive reduction in photospeed, the photobleaching is preferably energy efficient, such that relatively small amounts of actinic radiation (relative to the total amount needed for a complete image exposure) is sufficient to create substantial transparency in the image areas.

Preferably the photobleachable compound has one or more of the following properties: absorbs actinic radiation effectively; possesses an absorption spectrum that covers the emission spectrum of the actinic radiation sources at least partially, though preferably completely; possesses an absorption spectrum that overlaps the absorption spectrum of the initiator at least partially, and preferably completely; once exposed to actinic radiation, has an absorption spectrum that no longer covers the emission spectrum of the actinic radiation sources, at least partially, though preferably completely; and is sufficiently soluble in the photopolymerizable layer. "Sufficiently soluble" depends on the absorption coefficient and photobleaching properties of the photobleachable compound used. If the absolute magnitude of the absorption coefficient is low when compared with another photobleachable compound, but the bleaching efficiency of the two photobleachable compounds is the same, then more molecules of the photobleachable compound with the lower absolute magnitude of the absorption coefficient will be needed in the photopolymerizable layer in order to achieve the same effect as with the other photobleachable compound.

Compounds capable of photobleaching are known in the art and many representative examples of these compounds are described in "Photochromism, Molecules and Systems", edited by H. Durr, and H. Bouas-Laurent (Elsevier, 1990). Certain compounds whose photobleaching properties are derived from an interaction of two or more molecular entities are known. Examples of this type of bi- or multimolecular photobleachable compound include derivatives of the stibazolium salts as described in "Immobilization of Enzymes with Use of Photosensitive Polymers Having the Stilbazolium Group" by K. Ichimura, and S. Watanabe, *Journal of Polymer Science:* Polymer Chemistry Edition, Vol. 18, 891–902 (1980).

Another class of photobleachable compounds are dyes that exhibit significant photochromism based on the trans→cis isomerization of compounds with conjugated aromatic groups. In these compounds, photo-induced isomerization disrupts the electronic distribution in the molecule, leading to changes in optical absorbance. These photobleachable compounds consist of a single molecular entity.

If the photopolymerizable layer or the photosensitive printing element is prepared by a hot extrusion and calendering technique, which involves exposure to high temperatures above about 120° C., the photobleachable compound should be non-volatile and non-reactive with the at least one elastomeric binder, the at least one monomer and the initiator at that high temperature and be thermally stable. Thermal stability herein encompasses traditional chemical stability against chemical decomposition of the compound and stability against loss of photobleaching properties at high temperature. For a photopolymerizable layer wherein one or more of its ingredients are not thermally stable, liquid printing plates can be prepared using techniques well known in the art.

Preferred photobleachable compounds for the compositions, elements, processes and methods herein are those that exhibit thermal stability, particularly at hot extrusion and calendaring temperatures. Preferred photopolymerizable composition and photosensitive printing elements include such preferred thermally stable photobleachable compounds. More preferred photobleachable compounds are selected from the group consisting of an unsubstituted or a substituted naphthylvinyl-pyridine; an unsubstituted or a substituted styrylquinoline; a diphenyl maleic anhydride; an isomer of any of the foregoing; a derivative of any of the foregoing; and any combination of the foregoing. More preferred photopolymerizable compositions and photosensitive printing elements include such more preferred photobleachable compounds.

Photobleaching for the various naphthylvinyl-pyridine and styrylquinoline compounds occurs by the photo-induced trans to cis isomerization. Representative examples of such naphthylvinyl-pyridine compounds include 4-(1-naphthylvinyl)-pyridine; 4-(2-naphthylvinyl)-pyridine; 3-(1-naphthylvinyl)-pyridine; 3-(2-naphthylvinyl)-pyridine; 2-(1-naphthylvinyl)-pyridine; 2-(2-naphthylvinyl)-pyridine. Of these, 4-(2-naphthylvinyl)-pyridine is preferred and its trans-isomer is most preferred. Representative examples of styrylquinoline compounds include isomers of n-styrylquinolines and the n-styrylisoquinoline, such as 4-styrylquinoline; 2-styrylquinoline; 3-styrylisoquinoline; 4-styrylisoquinoline; 1-styrylisoquinoline and other isomers. Preferred styrylquinoline compounds are 4-styrylquinoline and 3-styrylquinoline and the trans-isomers of these two compounds are most preferred. Substituted naphthylvinylpyridines and styrylquinolines can contain one or more halogen atoms (independently selected from Cl, F, Br, or I), one or more in-ring heteroatoms, such as nitrogen, alkyl groups containing 1 to 10 carbon atoms, alkoxy groups having 1 to 10 carbon atoms; amine groups; or nitro groups. Various naphthylvinyl-pyridine and styrylquinoline compounds useful as the photobleachable compound herein are commercially available from TCI America, Portland, Oreg. or can be prepared by using Shaw condensation (c.f. Shaw, B. D., and Wagstaff, *J. Chem. Soc.* (1933), pp. 77; see also Cozzari, C. and Hartman, B. K., *Analytical Biochemistry,* 133 (1983) pp. 120).

The naphthylvinylpyridine and styrylquinoline photobleaching compounds are characterized by efficient photobleaching of their relatively high initial absorbance to a relatively low residual absorbance at 350–400 nm. This creates an excellent photosensitivity contrast between the image and non-image areas, thereby improving image quality. Specifically, both 4-(1-naphthylvinyl)pyridine and 4-styrylquinoline have excellent spectral overlap with industry standard long-wave UV sources such as Philips UV-A "TL"-series low-pressure mercury-vapor fluorescent lamps, and with the absorption spectrum of common initiators such as 2,2-dimethoxy-2-phenyl acetophenone, the 1-hydroxycyclohexylphenylketone and benzophenone mixture, and 2-benzyl-2-N,N-dimethylamino-1-(4- morpholinophenyl)-1-butanone. A preferred photobleachable compound and initiator combination is 4-(1-naphthylvinyl)pyridine and 2,2-dimethoxy-2-phenyl acetophenone.

Diphenylmaleic anhydride compounds photobleach by electrocyclization, and such photobleachable compounds include diphenyl maleic anhydride, and diphenyl maleic anhydride substituted with one or more independently selected halogen atoms, one or more alkyl groups each independently containing 1 to 10 carbon atoms, and one or more alkoxy groups each independently having 1 to 10 carbon atoms. Unsubstituted diphenyl maleic anhydride is the most preferred compound in this group. Although diphenyl maleic anhydride photobleaches efficiently, its residual absorption after photobleaching is higher than that of naphthylvinylpyridine and styrylquinoline. This higher residual absorbance makes diphenyl maleic anhydride more suitable for use in combination with initiators that are photobleachable. Diphenylmaleic anhydride compounds useful herein are commercially available from Aldrich Chemical Co., Milwaukee, Wis.

Photobleaching can also result from the decomposition of a molecular entity into two or more molecular entities which absorb actinic radiation only weakly or none at all. Several commercial photobleachable initiators (e.g., Dietliker, et al., Ibid.) undergo photobleaching as well as radical generation upon exposure to actinic radiation and are representative examples for this kind of photobleaching compound. However, the photochemical by-products of these photobleachable initiators do not sufficiently absorb actinic radiation to be used alone to provide the necessary halation protection function in the present invention. Preferred photobleachable initiators include phosphine oxides which can be usefull when used together with the photobleachable compounds described above that are capable of high residual absorbance. Preferred phosphine oxides include 2,4,6-trimethylbenzoyl-diphenylphosphine oxide, bis(2,6-dimethoxybenzoyl)-2,4-,4-trimethylpentyl phosphine oxide, and bisacylphosphine oxide.

The photobleachable compound can be present throughout the bulk of the photopolymerizable layer such as in a photopolymerizable layer of a single-layer construction. Alternatively, the photopolymerizable layer can be of a bi- or multi-layer construction. In such a bi- or multi-layer construction, the photobleachable compound can be present in all layers or in at least one layer. When the photopolymerizable layer is constructed from two or more distinct layers, image relief depth remains essentially independent of the imaging process. Such bi- or multi-layer flexographic printing plates can simplify or eliminate one control parameter, the backflash time, during flexographic printing plate making and thus can be easier to use. A bi- or multi-layer photopolymerizable layer with the image relief depth built in can be implemented using a photopolymerizable composition in each layer of the photopolymerizable layer which photopolymerizable composition may include a different amount of photobleachable compound from the composition in an adjacent layer of the photopolymerizable layer. For example, the photopolymerizable layer can include two layers, each of the said two layers including a photopolymerizable compositions which includes a different weight percent of the photobleachable compound.

A bi-layer or multi-layer photopolymerizable layer can be made by lamination using conventional techniques, or by co-extrusion (see U.S. Pat. No. 5,049,478).

To prevent diffusion of the photobleachable compound across the boundary of adjacent layers within a bi- or multi-layer photopolymerizable layer, the solubility of the photobleachable compound can be adjusted to favor its retention in a particular layer. A variation of this method is the insertion of a thin barrier layer that is impermeable to the photobleachable compound and is placed between adjacent layers within the bi- or multi-layer photopolymerizable layer. Such barrier layers can comprise the compositions described below for a release layer or an elastomeric capping layer. Alternatively the photobleachable compound can be immobilized within a particular layer by covalently attaching the photobleachable compound to a separate polymer or oligomer such that molecular entanglement substantially prevents diffusion of the photobleachable compound across the layer boundary. Polymers and oligomers suitable for the covalent attachment of photobleachable compounds include: polyvinylalcohols, poly(methyl methacrylate), poly(ethyl methacrylate), polystyrene, polyamide, polyester, poly-isocyanatoethylmethyl methacrylate (poly-ICEM), copolymer of isocyanatoethylmethyl methacrylate (ICEM) and methyl methacrylate, and copolymer of ICEM and dimethylaminoethyl methacrylate.

In both cases (bulk and layered presence), the photobleachable compound or a layer including such a photobleachable compound is not stripped off (except in the non-image area) and becomes an integral part of the final photosensitive printing element.

The at least one photobleachable compound can be present in the photo-polymerizable composition or the photopolymerizable layer in an amount sufficient to create the desired photosensitivity difference between the image and non-image areas, and to ensure a sufficiently fast cure rate. The inherent clarity of the photopolymerizable composition of the photopolymerizable layer, and the thickness of the photopolymerizable layer, and the photobleaching characteristic of the photobleachable compound can be factors in determining the amount of the photobleachable compound needed. It is preferred that the photobleachable compound be present in an amount ranging from about 0.001 to about 10% by weight of the photopolymerizable layer. More preferably an amount ranging from about 0.01 to about 5% by weight is present, and most preferably the amount ranges from about 0.02 to about 2% by weight.

The photopolymerizable layer can further include other additives depending on the final properties desired. Such additives include sensitizers, rheology modifiers, thermal polymerization inhibitors, tackifiers, plasticizers, colorants, antioxidants, antiozonants, or fillers.

The thickness of the photopolymerizable layer can vary over a wide range depending upon the type of flexographic printing plate desired, for example from about 0.005 inch to about 0.250 inch or greater (about 0.013 cm to about 0.64 cm or greater). For so-called "thin flexographic printing plates" typically the photopolymerizable layer can range from about 0.010 inch to about 0.067 inch (about 0.025 cm to about 0.17 cm) in thickness. Thicker flexographic printing plates can have a photopolymerizable layer of about 0.067 inch to about 0.250 inch or greater (0.17 cm to about 0.64 cm or greater). Since the halation problem can be worse in thinner flexographic printing plates, the photosensitive printing element of the present invention is particularly advantageous when used for preparing the thin flexographic printing plates.

The present photosensitive printing element may further comprise one or more additional layers, the first of such additional layers being disposed on the surface of the photopolymerizable layer. Additional layers following the first can be applied to the surface of each preceding layer. Additional layers on the photopolymerizable layer can include a barrier layer, such as a release layer or an elastomeric capping layer; an infrared-sensitive layer; and combinations thereof. If an infrared-sensitive layer is present, at least one barrier layer may be interposed between the photopolymerizable layer and the layer of infrared-sensitive material. If present, the barrier layer minimizes migration of certain materials between the photopolymerizable layer and the infrared-sensitive layer. Certain monomers and plasticizers can migrate over time if they are compatible with the materials in an adjacent layer. Such migration can occur, for example, from the photopolymerizable layer into the infrared-sensitive layer. In such instances, the infrared sensitivity of the infrared-sensitive layer may be altered. In addition, such migration can cause smearing and tackifying of the infrared-sensitive layer after imaging. If there is no compatibility between adjacent layers, there will be no migration. Thus, when an infrared-sensitive layer is used without a barrier layer, it is preferred that a binder in said infrared-sensitive layer be incompatible with at least one migratory material present in the photopolymerizable layer.

Since the surface of the photopolymerizable layer may be tacky, a release layer having a substantially non-tacky surface can be applied to the surface of the photopolymerizable layer. Such release layer can protect the surface of the photopolymerizable layer from being damaged during removal of an optional temporary coversheet and can ensure that the photopolymerizable layer does not stick to the coversheet. During image exposure, the release layer can prevent the image bearing mask from binding with the photopolymerizable layer. The release layer is insensitive to actinic radiation. In addition, the release layer can aid in removing trapped air between the image-bearing mask and the photopolymerizable layer, improving the fidelity of the image transfer. The release layer is also suitable as a first embodiment of the barrier layer (and may be referred to as a barrier layer herein) which is optionally interposed between the photopolymerizable layer and the infrared sensitive layer. The release layer is soluble, swellable, dispersible or liftable in developer solutions for the photopolymerizable layer both before and after exposure to actinic radiation. By "liftable" it is meant that the developer is able to lift off the release layer at least partially intact. This type of barrier layer is completely removed in both exposed and unexposed areas, along with the unexposed areas of the photopolymerizable layer, during processing with the developer. Examples of suitable material for the release layer are well known in the art, and include polyamides, polyvinyl alcohol, hydroxyalkyl cellulose, copolymers of ethylene and vinyl acetate, amphoteric interpolymers, and combinations thereof, see U.S. Pat. No. 4,423,135, U.S. Pat. No. 4,369,246, and U.S. Pat. No. 4,293,635.

The elastomeric capping layer should have an elastic modulus in the polymerized state not substantially less than the elastic modulus of the photopolymerizable layer in the exposed state. The composition of the elastomeric layer comprises an elastomeric polymeric binder, an optional second polymeric binder, and an optional nonmigratory dye or pigment. The elastomeric composition can also contain a monomer or monomers and a photoinitiating system. The elastomeric polymeric binder in the elastomeric composition is generally the same as or similar to the elastomeric binder present in the photopolymerizable layer. The elastomeric capping layer is typically part of a multilayer cover element that becomes part of the photosensitive printing element during calendering of the photopolymerizable layer. Such multilayer cover elements and compositions suitable as the elastomeric capping layer are disclosed in Gruetzmacher et al., U.S. Pat. No. 4,427,759 and U.S. Pat. No. 4,460,675. The elastomeric capping layer is also suitable as a second embodiment of barrier layer (and may be referred to as a barrier layer herein) which is optionally interposed between the photopolymerizable layer and the infrared sensitive layer. The elastomeric capping layer is one which is soluble, swellable or dispersible in the developer prior to exposure to actinic radiation, but is not affected by the developer after exposure to actinic radiation. When this type of barrier layer is used, it is removed by the developer only in those areas which are not exposed to actinic radiation. The elastomeric capping layer which has been exposed to actinic radiation remains on the surface of the polymerized areas of the photopolymerizable layer and becomes the actual printing surface of the printing plate.

It is also possible to use more than one additional layer or type of such additional layer. For example, an elastomeric capping layer may be present next to the photopolymerizable layer and this, in turn, may be overcoated with a release layer. The exact choice of additional layer(s) will depend on the nature of the photopolymerizable layer, whether or not the infrared-sensitive layer is present, the nature of the infrared-sensitive layer and other physical requirements of the photosensitive printing element.

The barrier layer, of either type, should be thick enough to act as an effective barrier to prevent migration and also be thin enough to minimize its effect on the exposure of the photopolymerizable layer to actinic radiation. In general, the barrier layer will have a thickness in the range of about 0.01 mil to about 3 mils (about 0.00025 mm to about 0.076 mm). A preferred thickness range is about 0.015 mil to about 2.5 mils (about 0.00038 mm to about 0.064 mm).

The photosensitive printing element may further comprise an infrared-sensitive layer which is substantially opaque to actinic radiation and which must be ablatable, i.e., vaporized or ablated, by exposure to infrared laser radiation. This infrared-sensitive layer can be used with or without the barrier layer. If used with the barrier layer, a preferred embodiment includes having the barrier layer disposed between the photopolymerizable layer and the infrared-sensitive layer. The infrared-sensitive layer comprises an infrared-absorbing material, a radiation-opaque material, and an optional binder. Dark inorganic pigments, such as carbon black and graphite, generally function as both infrared-sensitive material and radiation-opaque material. The optional binder is a polymeric material which can include a self-oxidizing polymer, a non-self-oxidizing polymer, a thermochemically decomposable polymer, polymers and copolymers of butadiene and isoprene with styrene and/or olefins, a pyrolyzable polymer, an amphoteric interpolymer, a material conventionally used as the release layer, as described above, and any combination of the foregoing. If the optional binder in the infrared-sensitive layer is not compatible with at least one migratory material, e.g. a low molecular weight compound (less than 30,000) monomer/s or plasticizer, in the photopolymerizable layer, the barrier layer is not needed between the infrared-sensitive layer and the photopolymerizable layer. It is with the knowledge of one skilled in the art to determine if such incompatibility or compatability exists between the components in the photopolymerizable layer and the infrared-sensitive layer, and determine if a barrier layer is needed. The thickness of the infrared-sensitive layer should be in a range to optimize both sensitivity and opacity, which is generally from about 20 Angstroms to about 50 micrometers. Such an infrared-sensitive layer can be employed in digital direct-to-plate image technology, as disclosed in U.S. Pat. No. 5,262,275; U.S. Pat. No. 5,719,009; U.S. Pat. No. 5,607,814; van Zoeren, U.S. Pat. No. 5,506,086; and EP 0 741 330 A1.

The photosensitive printing element of the present invention may further include a temporary coversheet on top of the uppermost layer of the photosensitive printing element, which uppermost layer may be the photopolymerizable layer, or any of the additional layers. One purpose of the coversheet is to protect the uppermost layer of the photosensitive printing element during storage and handling. It is important in digital-to-plate image processing that the coversheet be removed prior to exposing the infrared-sensitive layer to infrared laser radiation. Examples of suitable materials for the coversheet include a thin film of polystyrene, polyethylene, polypropylene, polycarbonate, fluoropolymer, polyamide, or polyester, which film can be subbed with release layers. The coversheet is preferably prepared from polyester, such as Mylar® polyethylene terephthalate film; most preferably the coversheet is 2-mil thick Mylar® film.

The present invention further concerns a method of preparing a photosensitive printing element, as described herein, comprising the steps of applying a photopolymerizable composition comprising at least one elastomeric binder, at least one monomer, an initiator having sensitivity to actinic radiation, and at least one photobleachable compound having sensitivity to actinic radiation to a support to form a photopolymerizable layer thereon. The present method may further include applying one or more of the additional layers, described herein, onto the photopolymerizable layer, the first of such layers being on the surface of the photopolymerizable layer and each succeeding layer being applied to the surface of the preceding layer.

The photopolymerizable layer can be prepared in many ways, for example by admixing the at least one elastomeric binder, the at least one monomer, the initiator, the at least one photobleachable compound, and any other ingredient, all ingredients of the mixture being as described above for the present photosensitive printing element or the present photopolymerizable composition or layer. The mixture can be in the form of a liquid, a gel or a solid, with the latter being the most preferred. The generally preferred technique is to mechanically mix the photopolymerizable composition in its molten or softened state and then extrude and calendar the mixture into sheets of the desired thickness. The present method is preferably used with a thermally stable photobleachable compound, most preferably with the photobleachable compound selected from the group consisting of a substituted or an unsubstituted ring-isomer of naphthylvinyl-pyridine; a substituted or an unsubstituted isomer of styrylquinoline; diphenyl maleic anhydride or a derivative thereof; and any combination of the foregoing.

An extruder can be used to perform the functions of melting, mixing, deaerating and filtering the photopolymerizable composition. The extruded mixture can then be calendered between the support and a temporary coversheet or a temporary coversheet which has been previously coated with the one or more additional layers, for example, a multilayer cover element. In the latter case it is arranged so that the additional layer furthest from the coversheet is next to the photopolymerizable layer during the calendering process. The adhesion between the additional layer/s and the temporary coversheet should be low, so that the additional layer/s will remain intact on the photopolymerizable layer when the temporary coversheet is removed. Alternatively, the photopolymerizable composition for the photopolymerizable layer can be placed between the support and the temporary coversheet or the additional layer coated temporary coversheet in a mold. The layers of material are then pressed flat by the application of heat and/or pressure.

If present, the infrared-sensitive layer is generally prepared by coating the infrared radiation sensitive material onto a second temporary coversheet. The infrared-sensitive layer can be applied using any known coating technique including spray coating. It also can be applied by vapor deposition under vacuum or by sputtering. The last methods are particularly useful for the infrared-sensitive layers which include metal. The infrared-sensitive layer can then be overcoated with the optional barrier layer or the two layers can be coated simultaneously. The adhesion of this second temporary coversheet should also be low so that the coversheet is easily removed from the infrared-sensitive layer after application to the photopolymerizable layer. The infrared-sensitive layer can alternatively be coated directly onto the barrier layer or on the photopolymerizable layer.

The present invention further concerns a method for making a flexographic printing plate comprising the steps of (a) imagewise exposing the photosensitive printing element of the present invention to actinic radiation to selectively polymerize portions of the photopolymerizable layer; and (b) treating the element resulting from step (a) to remove unpolymerized portions of the photopolymerizable layer to form a flexographic printing plate. In order to make the flexographic printing plate, the photopolymerizable printing element of the present invention is exposed to actinic radiation from suitable sources. A mercury vapor arc or a sunlamp can be used at a distance of about 1.5 to about 60 inches (about 3.8 to about 153 cm) from the photosensitive printing element. Exposure temperatures are preferably ambient or slightly higher, i.e., about 20° C. to about 35° C. Exposure time can vary from a few seconds to tens of minutes, depending on the intensities and wavelengths of the actinic radiation, the nature and volume of the photopolymerizable layer, the desired image resolution, the distance from the photosensitive printing element, and the amount of photobleachable compound added. The exposure process usually comprises a back exposure and a front image-wise exposure, although the former is not strictly necessary. The back exposure or "backflash" can take place before, after or during image-wise exposure. Backflash prior to image-wise exposure is generally preferred. Back flash time can range from a few seconds to about 10 minutes, and creates a shallow layer of polymerized material, or a floor, on the support side of the photopolymerizable layer and sensitizes the photopolymerizable layers and the support, helps highlight dot resolution and also establishes the depth of the plate relief. The floor improves adhesion of the photopolymerizable layer to the support, and provides better mechanical integrity to the photosensitive printing element.

Image-wise exposure can be carried out by exposing the photosensitive printing element through an image-bearing mask. The image-bearing mask, a black and white transparency or negative containing the subject matter to be printed, can be made from silver halides films or other means known in the art. The image-bearing mask is placed on top of the photosensitive printing element after first stripping off the temporary coversheet. Image-wise exposure can be carried out in a vacuum frame, which provides proper contact of the image-bearing mask and the top surface of the photosensitive printing element, and removes atmospheric oxygen which is known to interfere with the free-radical polymerization process. The photosensitive printing element is then exposed to actinic radiation. On exposure, the transparent areas of the negative allow addition polymerization or crosslinking to take place, while the opaque areas remain uncrosslinked. Exposure is of sufficient duration to crosslink the exposed areas down to the support or to the back exposed layer. Image-wise exposure time is typically much longer than backflash time, and ranges from a few to tens of minutes.

For direct-to-plate image transfer as disclosed in U.S. Pat. No. 5,262,275; U.S. Pat. No. 5,719,009; U.S. Pat. No. 5,607,814; van Zoeren, U.S. Pat. No. 5,506,086; and EP 0 741 330 A1, the presence of the infrared-sensitive layer is required. An image-bearing mask is formed directly onto the infrared-sensitive layer in situ using an infrared laser exposure engine. Image-wise exposure of printing plates through such a photoablative mask can be done without using a vacuum frame, simplifying the printing plate making process. The exposure process involves (1) image-wise ablating the infrared-sensitive layer of the photosensitive printing element described above to form a mask; and (2) overall exposing the photosensitive element to actinic radiation through the mask. The exposure can be carried out using various types of infrared lasers, which emit in the range 750 to 20,000 nm, preferably in the range 780 to 2,000 um. Diode lasers may be used, but Nd:YAG lasers emitting at 1060 nm are preferred.

Actinic radiation sources encompass the ultraviolet, visible and infrared wavelength regions. The suitability of a particular actinic radiation source is governed by the photosensitivity of the initiator and the at least one monomer used in preparing the flexographic printing plates. The preferred photosensitivity of most common flexographic printing plates are in the UV and deep visible area of the spectrum, as they afford better room-light stability. Examples of suitable visible and UV sources include carbon arcs, mercury-vapor arcs, fluorescent lamps, electron flash units, electron beam units, lasers, and photographic flood lamps. The most suitable sources of UV radiation are the mercury vapor lamps, particularly the sun lamps. Examples of industry standard radiation sources include the Sylvania 350 Blacklight fluorescent lamp (FR48T12/350 VL/VHO/180, 115w), and the Philips UV-A "TL"-series low-pressure mercury-vapor fluorescent lamps. These radiation sources generally emit long-wave UV radiation between 310–400 nm. Flexographic printing plates sensitive to these particular UV sources use initiators that absorb between 310–400 nm, and a suitable photobleachable compound should be absorptive in at least a portion of the 310–400 nm spectral range. It is contemplated that the imagewise exposure to infrared radiation for those embodiments which include the infrared-sensitive layer and the overall exposure to actinic radiation can be carried out in the same equipment. It is preferred that this is done using a drum, i.e., the photosensitive printing element is mounted on a drum which is rotated to allow for exposure of different areas of the photosensitive printing element.

Following overall exposure to UV radiation through the image-bearing mask, the photosensitive printing element is treated to remove unpolymerized areas in the photopolymerizable layer and thereby form a relief image. Treatment of the photosensitive printing element can include (1) "wet" development wherein the photopolymerizable layer is contacted with a suitable developer solution to washout unpolymerized areas and (2) "dry" development wherein the photopolymerizable layer is heated to a development temperature which causes the unpolymerized areas to melt or soften and is contacted with an absorbant material to wick away the unpolymerized material. Dry development may also be called thermal development. Wet development is usually carried out at about room temperature. The developer solution can include an organic solvent, an aqueous or a semi-aqueous solution, or water. The choice of the developer solution will depend primarily on the chemical nature of the photopolymerizable composition to be removed. A suitable organic solvent developer includes an aromatic or an aliphatic hydrocarbon, an aliphatic or an aromatic halohydrocarbon solvent, or a mixture of such solvents with a suitable alcohol. Other organic solvent developers have been disclosed in published German Application 38 28 551. A suitable semi-aqueous developer can contain water and a water miscible organic solvent and an alkaline material. A suitable aqueous developer can contain water and an alkaline material. Other suitable aqueous developer solution combinations are described in U.S. Pat. No. 3,796,602.

Development time can vary, but it is preferably in the range of about 2 to about 25 minutes. The developer solution can be applied in any convenient manner, including immersion, spraying, and brush or roller application. Brushing aids can be used to remove the unpolymerized portions of the photosensitive printing element. Washout can be carried out in an automatic processing unit which uses developer and mechanical brushing action to remove the unexposed portions of the resulting flexographic printing plate, leaving a relief constituting the exposed image and the floor.

Following treatment by developing in solution, the flexographic printing plates are generally blotted or wiped dry, and then more fully dried in a forced air or inflared oven. Drying times and temperatures may vary, however, typically the plate can be dried for about 60 minutes to about 120 minutes at about 60° C. High temperatures are not recommended because the support can shrink, and this can cause registration problems.

In thermal development, the photopolymerizable layer can be heated to a development temperature typically between about 40° C. and 200° C. which causes the unpolymerized areas to melt or soften. The photopolymerizable layer can then be contacted with an absorbant material to wick away the unpolymerized photopolymerizable composition. The polymerized areas of the photopolymerizable layer have a higher melting temperature than the unpolymerized areas and therefore do not melt at the development temperatures (see U.S. Pat. No. 5,215,859 and WO 98/13730). An apparatus suitable for thermal development of photosensitive printing elements is disclosed in U.S. Pat. No. 5,279,697.

The flexographic printing plates made using the photosensitive printing element of the present invention can be uniformly post-exposed to ensure that the photopolymerization process is complete and that the photosensitive printing element will remain stable during printing and storage. This post-exposure step can utilize the same radiation source as the main exposure.

Detackification is an optional post-development treatment which can be applied if the surface of the flexographic printing plate is still tacky, such tackiness not generally being removed in post-exposure. Tackiness can be eliminated by methods well known in the art, such as treatment with bromine or chlorine solutions. Such treatments have been disclosed in, for example, Gruetzmacher, U.S. Pat. No. 4,400,459; Fickes et al., U.S. Pat. No. 4,400,460; and German Patent 28 23 300. Detackification can also be accomplished by exposure to radiation sources having a wavelength not longer than 300 nm, as disclosed in European Published Patent Application 0 017927 and Gibson U.S. Pat. No. 4,806,506.

The flexographic printing plates made using the photosensitive printing elements of the present invention are for printing, particularly on surfaces which are soft and easily deformable, such as packaging materials, e.g., cardboard and plastic films. The photosensitive printing elements of the present invention can be used in the formation of seamless, continuous flexographic printing plates. The present photopolymerizable printing elements in the form of a flat sheet can be wrapped around a cylindrical form, usually a printing sleeve or the printing cylinder itself, and its edges fused together to form a seamless, continuous photosensitive printing element. In a preferred method, the photopolymerizable layer is wrapped around the cylindrical form and the edges joined. One process for joining the edges has been disclosed in German patent DE 28 44 426. The photopolymerizable layer can then be spray coated with at least one additional layer as described herein, if desired.

Continuous flexographic printing plates have applications in flexographic printing of continuous designs such as in wallpaper, decoration and gift wrapping paper. Continuous photosensitive printing elements are well-suited for mounting on conventional laser equipment. The sleeve or cylinder on which the photosensitive printing element can wrapped when the edges are fused, can be mounted directly into the laser apparatus where it functions as the rotating drum during the exposure step.

The present invention further provides a method of enhancing resolution in images produced from a flexographic printing plate, said plate comprising the present photosensitive printing element described, comprising the step of adding at least one photobleachable compound to the photopolymerizable composition. The components of the photosensitive printing element are as described above. By incorporating at least one photobleachable compound into the photopolymerizable layer, images produced using flexographic printing plates which include the present photosensitive printing element are enhanced over flexographic printing plates or elements not containing the photobleachable compound. Preferred photobleachable compounds for this method are those that are thermally stable. More preferred photobleachable compounds for this method are those selected from the group consisting of an unsubstituted or a substituted naphthylvinyl pyridine; an unsubstituted or a substituted styrylquinoline; a diphenyl maleic anhydride; an isomer of any of the foregoing; a derivative of any of the foregoing; and any combination of the foregoing.

All publications or references mentioned herein are hereby incorporated by reference unless otherwise indicated.

EXAMPLES

In the following examples, Cyrel® 2001E UV Exposure Unit, Cyrel® 2001P Plate Processor, Cyrel® 2001D Dryer, Cyrel® 3001 DLF Plate Finisher, Optisol® solvent, Teflon® film, and Mylar® polyester support and coversheets are products sold by E. I. du Pont de Nemours and Company, Wilmington, Del. Kraton is a polybutadiene-styrene block copolymer available from Shell Chemical, part of the Royal Dutch/Shell Group, Houston, Tex. Huls Polyoil and Nisso PB liquid polybutadiene is manufactured by Huls America, Somerset, N.J. and Nippon Soda, Tokyo, Japan respectively. Zappon 346 red dye is made by BASF, Coatings and Colorants Division, Mt. Olive, N.J. 4-(1-naphthylvinyl) pyridine and 2-styryl quinoline were obtained from TCI America, Portland, Oreg., and diphenyl maleic anhydride was obtained from Aldrich Chemical Co., Milwaukee, Wis.

Example 1 and

Comparison 1

This example demonstrates the preparation of a photosensitive printing element of the present invention which includes 4-(1-naphthylvinyl)pyridine as a photobleachable compound. This example also illustrates the beneficial effect of a photobleachable compound in reducing halation caused by scattered actinic radiation. By way of FIG. 1 and FIG. 2, the photosensitive printing element prepared that included a photobleachable compound (Example 1) and the photosensitive printing element prepared that did not contain the photobleachable compound (Comparison 1) can be compared.

An admixture containing 117 g of Kraton 1102 CU, 29 g of Huls Polyoil 130, 28 g of Nisso PB 1000, 20 g of 1,6-hexane diol diacrylate, 0.5 g of hydroxy-ethyl acrylate, 0.01 g of Zappon 346, 2 g of 2,6-di t-butyl-4-methyl phenol, 4 g of 2,2-dimethoxy-2-phenyl acetophenone, 0.06 g of 4-(1-naphthylvinyl)pyridine and 80 ml of methylene chloride were homogenized in a hot roll mill at 140° C. Photosensitive printing elements measuring 6"×7"×0.062" (15.224 cm×17.78 cm×0.15748 cm) were prepared as follows: about 37 g of the admixture was placed into a 0.067" (0.17018 cm) thick, rectangular aluminum die and sandwiched between a 5 mil Mylar® polyester support sheet and a coversheet coated with a silicon release barrier coating. The assembly was placed into a hydrostatic hot press at 140° C. and brought to a pressure of 300 psi (81.43 megapascal/meter). The pressed plate was then allowed to cool to room temperature under pressure. Plate thickness uniformity was about ±0.003" (0.00762 cm). At least three plates were made for each admixture. To ensure better experimental accuracy, all elements were stored away from any light exposure under ambient atmosphere for a minimum of two weeks before used.

An admixture with the identical composition as Example 1, except without the photobleachable compound, i.e. 0.06 g of 4-(1-naphthylvinyl)pyridine, was roll-milled for use as a control (Comparison 1).

The elements were exposed as follows. The actinic radiation source used was a Cyrel® 2001E UV Exposure Unit, equipped with Philips UV-A "TL"-series low-pressure mercury-vapor fluorescent bulbs. The wavelength of the emission was primarily and broadly centered around 370 nm. The elements of Example 1 were given a uniform, 60-second backflash to create an image relief depth of ~0.020" (0.0508 cm). Six identical image-bearing masks were used for 3 elements during front image-wise exposure. The 3.5"×6" (8.89 cm×15.24 cm) silver halide masks contained standard image features such as: 1) 1 cm² patches of 1%, 2%, 3%, 4%, 5% positive high-light dots, and of 70%, 80%, 90% and 100% negative solids; 2) vignettes of positive 0.5%–10%, and of negative 95%–100%, at increments of ~0.4%; 3) isolated positive and negative dots of 0.1, 0.2, 0.4 and 0.8 mm diameters; and 4) positive and negative reverse lines of 0.1, 0.2, 0.4 and 0.8 mm wide. Exposure times used were 10, 20, 40, 80, 100, and 120 minutes. The exposed elements were then developed using a standard procedure in a Cyrel® 2001P Plate Processor wherein they were washed with an Optisol® wash solution for 30 minutes. The resulting flexographic printing plates were then dried at 60° C. in a Cyrel® 2001D Dryer for ~2 hours. Post-exposure (10 minutes) and detacking (10 minutes) were done in a Cyrel® 3001 DLF Plate Finisher. Except for the backflash time and image-wise exposure time, the elements for Comparison 1 were exposed with the same actinic light source and developed using the same procedures.

For Example 1, minimum image-wise exposure time, defined as the shortest time needed for the flexographic printing plate to hold the 0.5% high-light dots, was determined to be about 20 minutes. This image-wise exposure time was substantially shorter than the 120 minutes used since it is the objective of this experiment to over-expose the element by subjecting it to a more than usual amount of scattered actinic radiation. Thus, compared to the minimum exposure time of 20 minutes, the 120 minutes exposure represents a 6× over-exposure. FIG. 1 documents the image quality of the flexographic printing plate of Example 1 under 6× over-exposure, i.e. 120 minutes.

Figure 2:
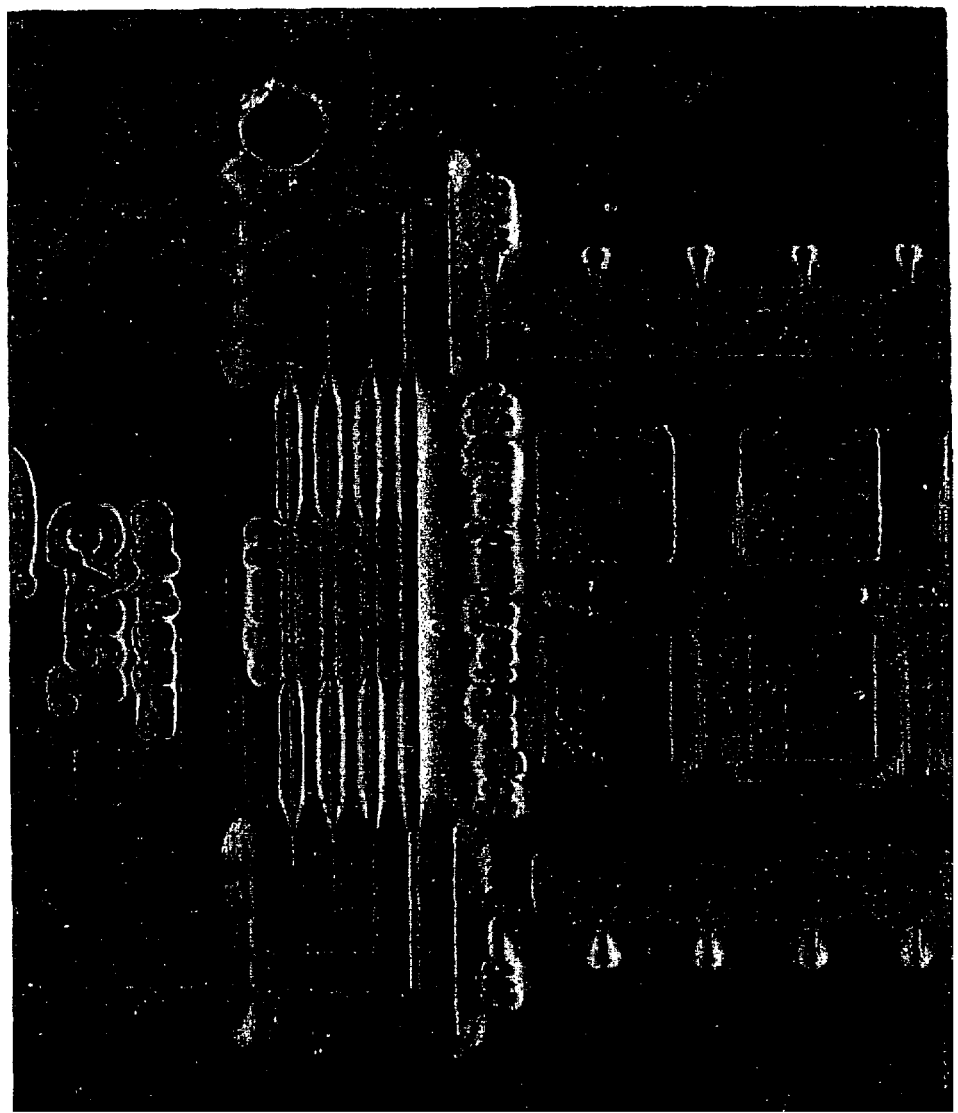
FIG. 2 is a photograph of a flexographic printing plate of Comparison 1.

For Comparison 1, uniform backflash of 20 seconds was given to 2 elements to provide an image relief depth of 0.030" (0.0762 cm). Front image-wise exposure times of 10, 20, 40 and 80 minutes were used along with four 3.5"×6" (8.89 cm×15.24 cm) silver halide image-bearing masks identical to the ones used for Example 1. Minimum image-wise exposure time was determined to be about 15 minutes, giving an over-exposure factor of 5.3× for the longest exposure time element (i.e., 80 minutes). FIG. 2 documents the image quality of the flexographic printing plate of Comparison 1.

A comparison of FIGS. 1 and 2 revealed that in the absence of a photobleachable compound, considerable "halo"—i.e. a broad polymerized shoulder around solid image areas—formation occurred readily when the plate was over-exposed. The addition of 0.03 wt. % photobleachable compound, 4-(1-naphthylvinyl)pyridine, substantially reduced photopolymerization caused by scattered and/or reflected actinic radiation, leading to relief image with visibly less "halo", especially under prolonged image-wise exposure time. Example 1 further demonstrated that a photobleachable compound such as 4-(1-naphthylvinyl)pyridine can enhance exposure latitude of flexographic printing plates.

Microscope examination of the flexographic printing plates from Example 1 also revealed that these plates, on average, consistently held finer high-light dots (<2%) than the standard, control plates of Comparison 1. It is believed that the finer high-light dots was due to the fact that smaller dot-gain resulted during transfer of the image from the silver-halide image bearing mask to the photosensitive printing element. This in turn was due to enhancement in intensity contrast caused by the photobleaching of 4-(1-naphthylvinyl)pyridine. The ability of the flexographic printing plate prepared in the present invention to hold smaller dots affords such plates better tonal control of the final print image. Therefore, flexographic printing plates prepared from photosensitive printing elements which include a photobleachable compound, such as 4-(1-naphthylvinyl)pyridine, are particularly suitable for high quality image reproduction.

Example 2 and

Comparison 2

Figure 3:
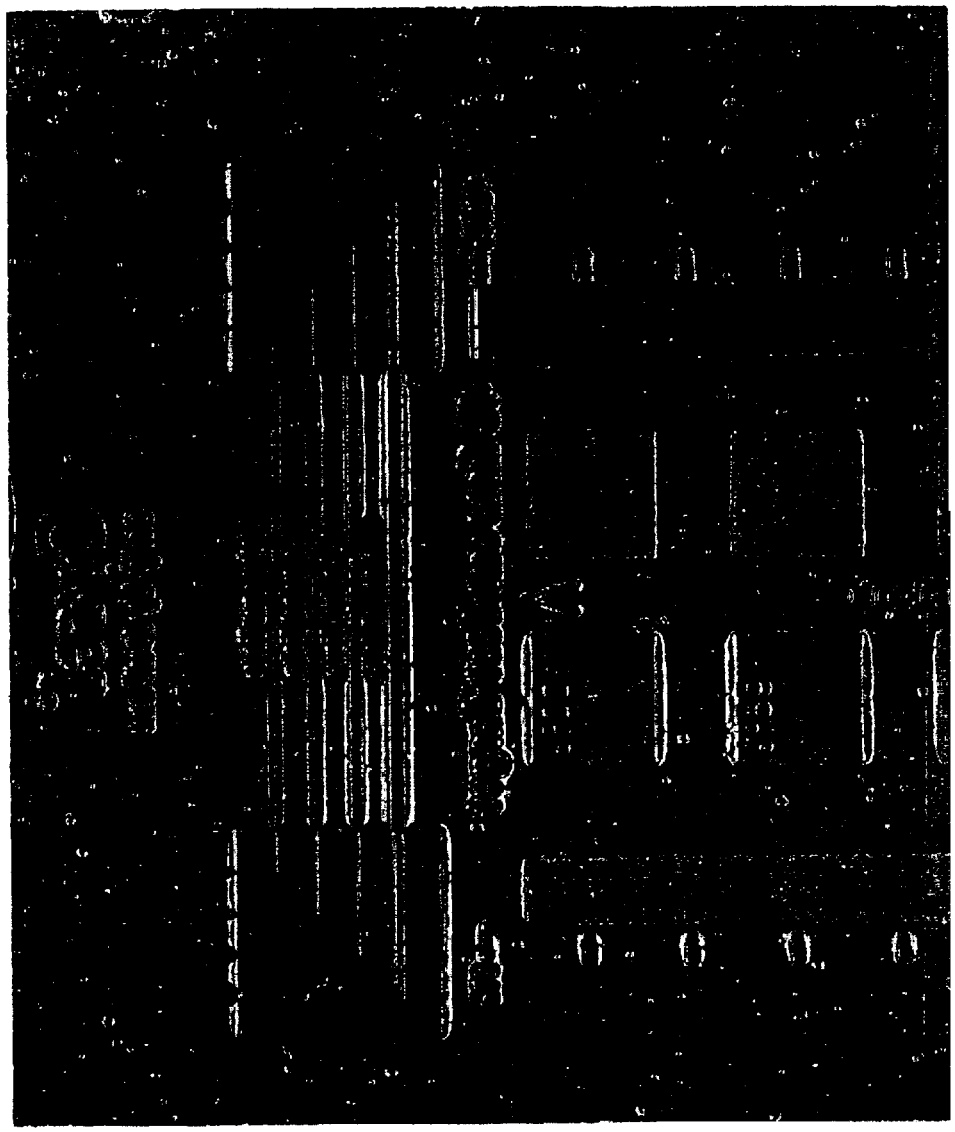
FIG. 3 is a photograph of a flexographic printing plate of Example 2.

Example 2 demonstrates that photosensitive printing elements containing 4-(1-naphthylvinyl)pyridine work particularly well for making "thin" flexographic printing plates. Thin flexographic printing plates are plates wherein the photopolymerizable layer ranges between about 0.010" to about 0.067" (about 0.0254 cm to about 0.17 cm) thick. Photosensitive printing elements of Comparison 2 have a 0.035" (0.089 cm) thick photopolymerizable layer having an optical absorbance at 370 nm about twice that of standard 0.067" (0.17 cm) flexographic printing plates, such as those prepared in Comparison 1. The 2× higher absorbance, achieved by the addition of more initiator, 2,2-dimethoxy-2-phenyl acetophenone, more effectively attenuates specular reflection from the support and the glass surfaces of the exposure unit. Although this is an improvement over the standard composition used in Comparison 1, it offers no differentiation between image and non-image area. In contrast, in Example 2, the amount of photobleachable compound, 4-(1-naphthylvinyl)-pyridine, was twice the amount present in Example 1. By way of FIGS. 3 and 4, photosensitive printing elements which included a photobleachable compound (Example 2) and those lacking the photobleachable compound (Comparison 2), albeit with twice the light attenuation power, can be compared.

An admixture containing 117 g of Kraton 1102 CU, 29 g of Huls Polyoil 130, 28 g of Nisso PB 1000, 20 g of 1,6-hexane diol diacrylate, 0.5 g of hydroxy-ethyl acrylate, 0.01 g of Zappon 346, 2 g of 2,6-di t-butyl-4-methyl phenol, 4 g of 2,2-dimethoxy-2-phenyl acetophenone, 0.12 g of 4-(1-naphthylvinyl)pyridine and 80 ml of methylene chloride were homogenized in a hot roll mill at 140° C. Preparation of the photosensitive printing elements was essentially the same as in Example 1, except that a 0.032" (0.08128 cm) thick, rectangular aluminum die was used instead. Similarly, an admixture containing 117 g of Kraton 1102 CU, 29 g of Huls Polyoil 130, 28 g of Nisso PB 1000, 20 g of 1,6 hexane diol diarylate, 0.5 g of hydroxy-ethyl acrylate, 0.01 g of Zappon 346, 2 g of 2,6-di t-butyl, 4-methyl phenol, 8 g of 2,2-dimethoxy-2-phenyl acetophenone, and 80 ml of methylene chloride were roll-milled for use as a control (Comparison 2). The flexographic printing plate thickness uniformity was about ±0.003" (0.00762 cm). At least three elements were made for each admixture. To ensure better experimental accuracy, all elements were stored away from any light exposure under ambient atmosphere for a minimum of two weeks before used.

Table 1 summarizes the exposure parameters used for the two sets of elements.

TABLE 1

|  | EXAMPLE 2 | COMPARISON 2 |
| --- | --- | --- |
| Back Flash [sec.] | 17 | 10 |
| Image Relief | 0.019 in. | 0.022 in. |
|  | (0.048 cm) | (0.056 cm) |
| Front Exposure [min.] |  |  |
| #1 | 10 | 5 |
| #2 | 17 | 10 |
| #3 | 24 | 15 |
| #4 | 31 | 20 |

Plate development procedures were identical for both sets of elements, with a wash time of about 20 minutes, and a drying time of about 35 minutes.

Figure 4:
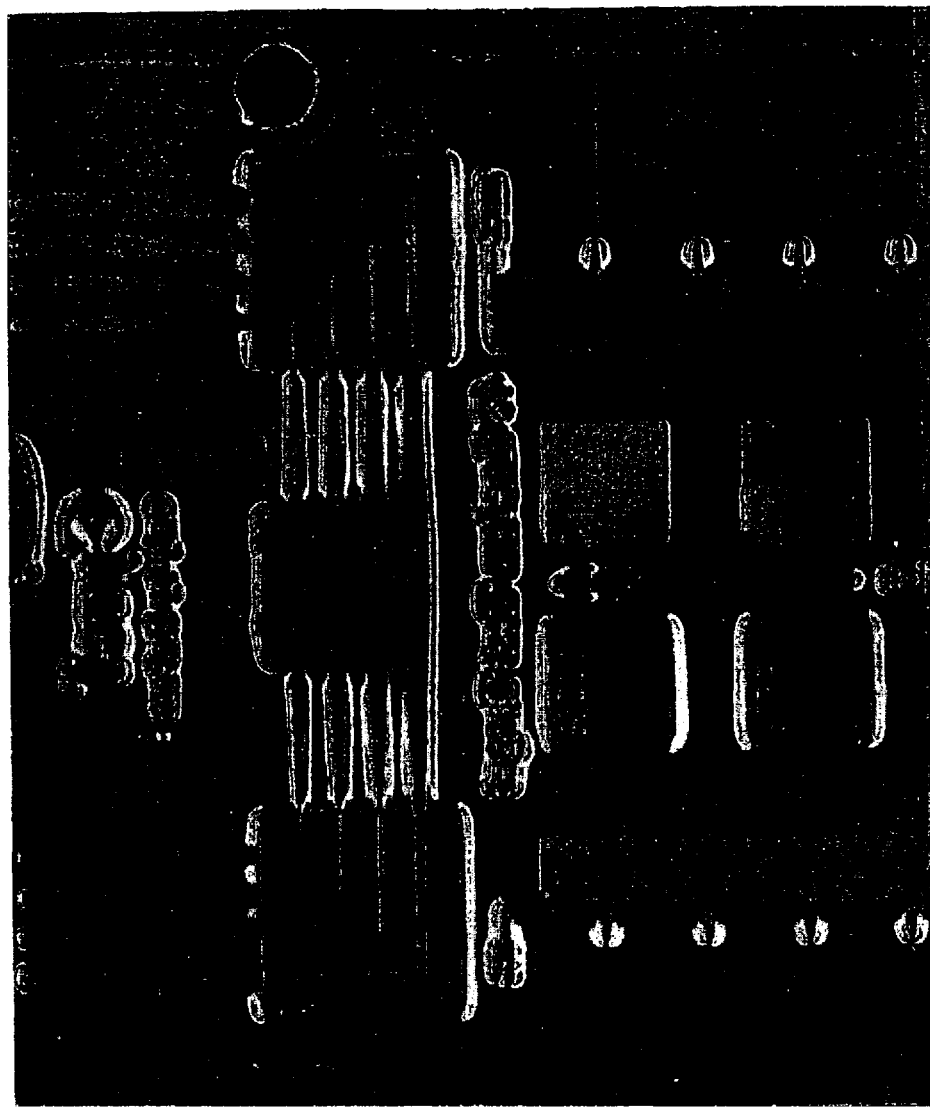
FIG. 4 is a photograph of a flexographic printing plate of Comparison 2.

At 17 minutes front image-wise exposure time, it was observed that 1% high-light dots were holding properly for the resulting flexographic printing plates of Example 2. Similarly, 1% high-light dots held for the resulting flexographic printing plates of Comparison 2 at front image-wise exposure time of 10 minutes. Defining these exposure times as "comparable" minimal exposure times, FIGS. 3 and 4 document the quality of relief image achieved under 1.8× and 1.5× over-exposure conditions for, respectively, plates from Example 2 and Comparison 2. FIG. 4 shows that at 1.5× over-exposure (i.e., 15 minutes), formation of a "halo" is becoming evident, with concomitant fill-in of negative reverse lines. In contrast, FIG. 3 reveals minimal formation of "halo" at 1.8× over-exposure (i.e., 31 minutes) with still clearly defined negative reverse lines. These observations showed that the use of a photobleachable compound, such as 4-(1-naphthylvinyl)-pyridine to prepare a "thin" flexographic printing plate can improve overall quality of relief image of the resulting plate.

Example 3

Example 3 demonstrates the advantage of a multi-layer construction in preparing the photopolymerizable layer of the photosensitive printing element of the present invention. Three desirable properties are demonstrated: 1) the judicious use of a photobleachable compound in a bi-layer construction for the photopolymerizable layer is effective for making flexographic printing plates with fixed, built-in image-relief depth; 2) a photobleachable compound can be used effectively in a surface capping layer; and 3) flexographic printing plates with good image quality and unusually thin (<0.010" (0.0254 cm)) image relief can be made using a photobleachable compound.

Two admixtures were roll-milled, one for each layer of a bilayer photopolymerizable layer. The composition for the bottom "substrate" layer consisted of 117 g of Kraton 1102 CU, 29 g of Huls Polyoil 130, 28 g of Nisso PB 1000, 20 g of 1,6-hexane diol diacrylate, 0.5 g of hydroxy-ethyl acrylate, 0.01 g of Zappon 346, 2 g of 2,6-di t-butyl-4-methyl phenol, 4 g of 2,2-dimethoxy-2-phenyl acetophenone, and 80 ml of methylene chloride. The composition for the top "capping" layer was the same as the substrate layer except 0.4 g of the photobleachable compound 4-(1-naphthylvinyl)pyridine (or 0.2 wt. %) was added. The initial optical absorbance of the substrate layer was ~7.1 $cm^{-1}$, and of the capping layer, ~53 $cm^{-1}$. The high photobleachable absorber content of the capping layer substantially decreased its photosensitivity, making it effectively insensitive to photo-curing during the short backflash time. This substantial difference in photosensitivity of the substrate and the capping layer created the built-in image relief depth property of the bilayer embodiment of the photopolymerizable layer.

A sheet of the substrate composition and the capping composition were hot pressed separately, the former between a polyester support and a 4-mil thick Teflon® film, and the latter, between a 4-mil thick Teflon® film and coversheet coated with a barrier layer. The die thicknesses were reduced so as to yield a substrate layer and a capping layer that were 0.015" (0.0381 cm) and 0.008" (0.02032 cm) thick, respectively. Both the substrate layer and the capping layer were stored separately away from any light source for two weeks before use.

Figure 5:
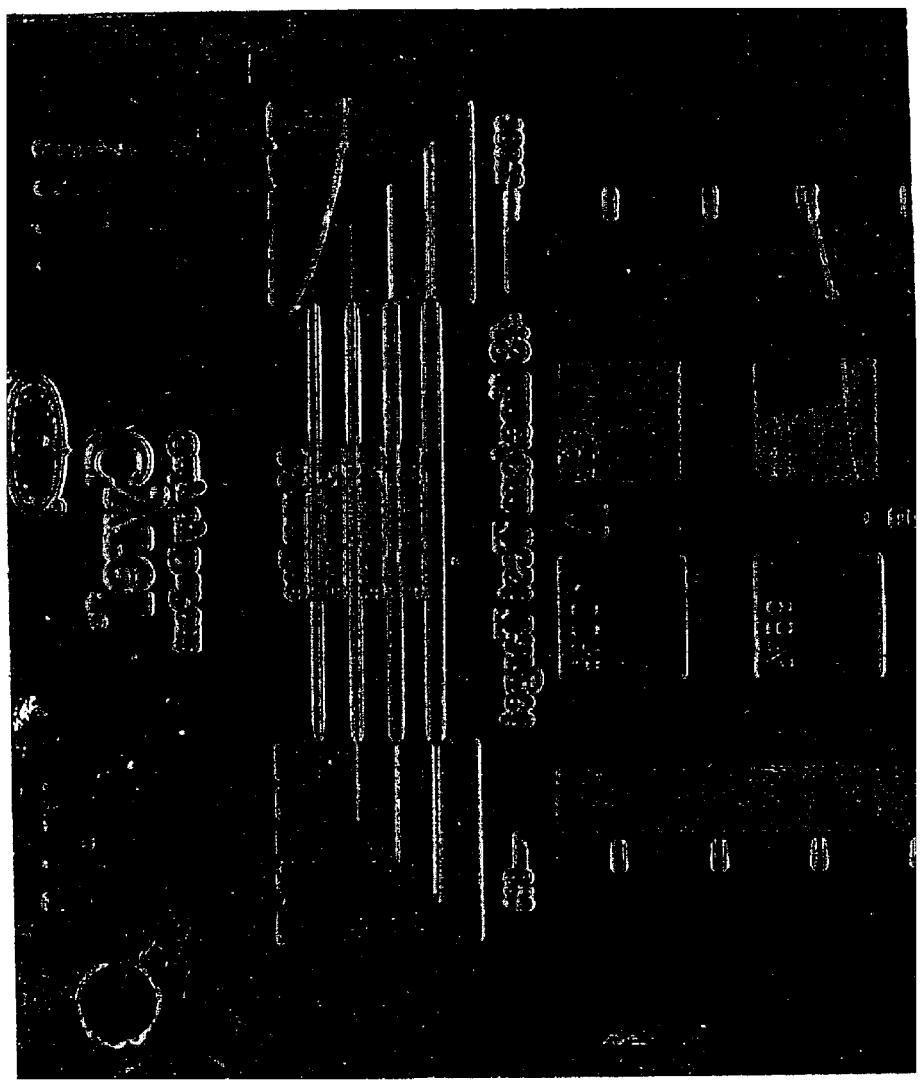
FIG. 5 is a photograph of a flexographic printing plate of Example 3.

Next, the Teflon® films were peeled off and the substrate layer and the capping layer were cold-laminated together to give a bilayer photopolymerizable layer of ~0.023" (0.05842 cm) thick. The photosensitive printing element was then exposed immediately using the procedure outlined in Examples 1 and 2 above. Uniform backflash time was 20 seconds, while front image-wise exposure times were 20, 30, 40 and 50 minutes. The exposed elements were washed in a Cyrel® 2001P Plate Processor for 20 minutes and dried for 35 minutes. The resulting flexographic printing plates had an image-relief was 0.008" (0.02032 cm), which was the same as the thickness of the capping layer. This suggested that negligible curing of the capping layer occurred during backflash. With 20 minutes image-wise exposure, 1% highlight was found to cure properly, although 0.5% dots were partially washed off. FIG. 5 documents the quality of the relief image obtained using this bilayer photosensitive element and an image-wise exposure time of 40 minutes. Despite the relatively thin 0.008" (0.02032 cm) image relief depth, all negative reverse lines remained un-filled and well defined.

In the experiments below, UV absorption properties are measured. For this reason an initiator was not included in the polymeric medium because the initiator can also absorb the UV light and thus mask the photobleaching data for the photobleachable compound. Thus examples which would include both the initiator and the photobleachable compound would show the combined effect of both the absorption by the initiator and the absorption by the photobleachable compound. Such examples are therefore less useful in providing information about the percent photobleaching efficiency of the photobleachable compound. In general, the absorbance of the photobleachable compound can be added arithmetically to that of the initiator and its photoproducts. (The monomer was also not included in the experiments below because it is not believed to: affect the experimental observation.)

Example 4 and

Comparison 3

This example demonstrates the excellent photobleaching properties of 4-(1-naphthylvinyl)-pyridine in a polymeric medium, and that these properties are thermally stable. This is compared to the substantial loss of photobleaching properties at high temperature of a photobleaching agent diphenyl-nitrone under substantially similar preparative conditions.

Example 4: Into 10 ml of a 50/50 mixture of Nisso-PB1000/HULS Polyoil 130, 0.3 mg of 4-(1-naphthylvinyl)-pyridine (NVP) was dissolved to give a thick $1.2 \times 10^{-4}$ M solution of NVP. The solution was placed in a 160° C. oven for 2 hours, and the optical properties of the solution before and after exposure to actinic radiation were recorded in a spectrophotometer. A $1.2 \times 10^{-4}$ M solution of NVP in tetrahydrofuran (THF) was used as a control. Table 2 summarizes the observed photobleaching of optical absorbance at 365 nm, and demonstrated that the photobleaching properties of NVP were thermally stable at least up to 160° C.

TABLE 2

| Sample | Before UV exposure | After UV exposure | Absorbance change |
|---|---|---|---|
| Control (in THF) | 1.1683 | 0.1440 | 1.0243 |
| Unheated (20° C.) | 1.2747 | 0.2193 | 1.0554 |
| Heated (160° C.) | 2.0543 | 0.8221 | 1.2322 |

Comparison 3: Into 20 ml of a 50/50 mixture of Nisso-PB1000/HULS Polyoil 130, 0.25 mg of diphenyl-nitrone (DPN) was dissolved to give a thick $6.2 \times 10^{-5}$ M solution of DPN. The solution was placed in a 140° C. oven for 2 hours, and the photobleaching properties of the solution before and after exposure to actinic radiation were recorded in a spectrophotometer. A $6.2 \times 10^{-5}$ M solution of DPN in tetrahydrofuran (THF) was used as a control. Table 3 summarizes the observed photobleaching of optical absorbance at 340 nm, and demonstrates that even though diphenyl-nitrone exhibited exceptional photobleaching properties in dilute solution, it is unsuitable for use in polymeric medium that contains unsaturated vinyl moieties and must undergo heat treatment during processing.

TABLE 3

| Sample | Before UV exposure | After UV exposure | Absorbance change |
|---|---|---|---|
| Control (in THF) | 0.7548 | 0.0399 | 0.7125 |
| Heated (140° C.) | 0.2574 | 0.2074 | 0.0500 |

Example 5

This example demonstrates the photobleaching properties of diphenyl maleic anhydride included in an elastomeric polymer medium, which medium is similar to those commonly used for preparing photosensitive printing elements.

Two identical solutions consisting of 10.1 g of Kraton 1102, 2.4 g of Nisso-PB 1000, and 2.5 g of HULS Polyoil 130 in 75 ml of tetrahydrofuran were made. Approximately 0.7 and 2.1 cc of a 0.12 wt % diphenyl maleic anhydride solution were added into each solution, respectively. The solutions were dried at 40° C. for several days and pressed in a hot 120° C. hydrostatic press to form uniform 10-mil thick free-standing films. The films were exposed successively to actinic radiation, and their optical density at 365 nm was monitored with a spectrophotometer immediately after each exposure. Table 4 summarizes the systematic reduction of the optical density due to photobleaching of diphenyl maleic anhydride in the polymeric medium. Each unit of exposure corresponds to 2.7 mJ/cm$^2$ of UV energy density.

TABLE 4

| Units of UV Exposure | 0.7 cc DMA | 2.1 cc DMA |
|---|---|---|
| 0 | 1.97 | 6.56 |
| 2 | 1.68 | 6.20 |
| 4 | 1.45 | 5.85 |
| 6 | 1.28 | 5.61 |
| 10 | 1.05 | 5.08 |
| 19 | 0.83 | 4.10 |
| 39 | 0.81 | 3.09 |
| 78 | 0.78 | 2.62 |
| 156 | 0.75 | 2.20 |

Compared to 4-(1-naphthylvinyl)-pyridine, which photobleached with ~83% efficiency (see Example 4, Table 2, row 2), diphenyl maleic anhydride photobleached with only ~62% efficiency, i.e. 1-(Absorbance after 156 units exposure)/(Absorbance after 0 unit exposure). The relatively high steady-state absorbance of diphenyl maleic anhydride makes this photobleachable compound particularly suitable for use with a photobleachable initiator.

Example 6

This example demonstrates the photobleaching properties of 2-styryl quinoline included in an elastomeric polymer medium, which medium is similar to those commonly used for photosensitive printing elements.

A solution consisting of 10.1 g of Kraton 1102, 2.4 g of Nisso-PB1000, and 2.5 g of HULS Polyoil 130 in 75 ml of tetrahydrofuran were made. Approximately 88 mg of 2-styryl quinoline were added into the solution. The solution was dried at 40° C. for several days and pressed in a hot 120° C. hydrostatic press to form a uniform ~10-mil thick free-standing film. The film was exposed successively to actinic radiation to 250 units and 500 units, and the optical density of the film at 365 nm was monitored with a spectrophotometer immediately before and after each exposure. Table 5 summarizes the systematic reduction of the optical density due to photobleaching of 2-styryl quinoline in the polymeric medium. Each unit of exposure corresponds to 2.2 mJ/cm$^2$ of UV energy density.

TABLE 5

| Units of UV Exposure | Absorbance of 10-mil film | Absorbance change |
|---|---|---|
| 0 | 2.02060 | |
| 250 | 1.46546 | 0.55513 |
| 500 | 1.15915 | 0.86145 |

Example 7

This example demonstrates the photobleaching properties of a flexographic printing plate composition which includes the photobleachable compound NVP. Unlike Examples 4–6, these compositions include monomer and an initiator.

A printing plate composition containing ~0.03 wt % photobleachable compound NVP was obtained by roll-milling an admixture containing 117 g of Kraton 1102 CU, 29 g of Huls Polyoil 130, 28 g of Nisso PB 1000, 20 g of 1,6-hexane diol diacrylate, 0.5 g of hydroxy-ethyl acrylate, 0.01 g of Zappon 346, 2 g of 2,6-di t-butyl-4-methyl phenol, 4 g of 2,2-dimethoxy-2-phenyl acetophenone, 0.06 g of NVP and 80 ml of methylene chloride at 140° C. A similar composition, except with 0.12 g of NVP was also made to give a mixture containing ~0.06 wt % photobleachable compound. A small amount of each of these mixtures was pressed in a hot 140° C. hydrostatic press to form ~10-mil thick free standing films. The absorbance at 370 nm of the as pressed films was then measured with a spectrophotometer as in Examples 4–6 above. The films were then exposed to 160 units of actinic radiation (~2.7 mJ/cm$^2$), and the absorbance of the film at 370 nm was measured again to obtain the bleached absorbance. Table 6 summarizes the degree of photobleaching obtained from these films.

TABLE 6

| Units of UV Exposure | ~0.06% NVP | ~0.03% NVP |
|---|---|---|
| Before Exposure | 0.6339 | 0.4456 |
| After 160 Units Exposure | 0.2336 | 0.1909 |
| % Bleaching | 63.1% | 57.2% |

What is claimed is:

1. A photopolymerizable composition, comprising: at least one elastomeric binder, at least one monomer, an initiator having sensitivity to actinic radiation, and at least one photobleachable compound having sensitivity to the actinic radiation, wherein said photobleachable compound is thermally stable, and when exposed to the actinic radiation changes to a photobleached state exhibiting reduction in absorbance of the actinic radiation at which polymerization proceeds in areas exposed to the actinic radiation, said photobleachable compound retaining absorption of the actinic radiation in areas not exposed to the actinic radiation.

2. A method of preparing a photosensitive printing element comprising the steps of:

applying a photopolymerizable composition comprising at least one elastomeric binder, at least one monomer, an initiator having sensitivity to actinic radiation, and at least one photobleachable compound having sensitivity to the actinic radiation, wherein said photobleachable compound is thermally stable and when exposed to the actinic radiation changes to a photobleached state exhibiting reduction in absorbance of the actinic radiation at which polymerization proceeds in areas exposed to the actinic radiation, said photobleachable compound retaining absorption of the actinic radiation in areas not exposed to the actinic radiation and is selected from the group consisting of an unsubstituted or a substituted naphthylvinyl pyridine, an unsubstituted or a substituted styrylquinoline, a diphenyl maleic anhydride, isomers of any of the foregoing, derivatives of any of the foregoing, and any combination of the foregoing, to a support to form a photopolymerizable layer thereon.

3. The method of claim 2 further comprising applying an infrared-sensitive layer, at least one barrier layer, or an infrared-sensitive layer and at least one barrier layer upon the surface of the photopolymerizable layer.

4. A method for making a flexographic printing plate comprising:
(a) imagewise exposing a photopolymerizable printing element having a layer of a composition comprising: at least one elastomeric binder, at least one monomer, an initiator having sensitivity to actinic radiation, and at least one photobleachable compound having sensitivity to the actinic radiation, wherein said photobleachable compound is thermally stable and when exposed to the actinic radiation changes to a photobleached state exhibiting reduction in absorbance of the actinic radiation at which polymerization proceeds in areas exposed to the actinic radiation, said photobleachable compound retaining absorption of the actinic radiation in areas not exposed to the actinic radiation and is selected from the group consisting of an unsubstituted or a substituted naphthylvinyl pyridine, an unsubstituted or a substituted styrylquinoline, a diphenyl maleic anhydride, isomers of any of the foregoing, derivatives of any of the foregoing, and any combination of the foregoing, to actinic radiation to selectively polymerize portions of the layer; and
(b) treating the element resulting from step (a) to remove unpolymerized portions of the layer to form the flexographic printing plate.

5. A method of enhancing resolution in images produced from a flexographic printing plate, said flexographic printing plate comprising a photosensitive printing element comprising a photopolymerizable layer, said photopolymerizable layer comprising a photopolymerizable composition comprising at least one elastomeric binder, at least one monomer, and an initiator having sensitivity to actinic radiation on a support, comprising the steps of:
adding at least one photobleachable compound having sensitivity to the actinic radiation to the photopolymerizable composition, wherein said photobleachable compound is thermally stable and when exposed to the actinic radiation changes to a photobleached state exhibiting reduction in absorbance of the actinic radiation at which polymerization proceeds in areas exposed to the actinic radiation, said photobleachable compound retaining absorption of the actinic radiation in areas not exposed to the actinic radiation and is selected from the group consisting of an unsubstituted or a substituted naphthylvinyl pyridine, an unsubstituted or a substituted styrylquinoline, a diphenyl maleic anhydride, isomers of any of the foregoing derivatives of any of the foregoing, and any combination of the foregoing.

6. The method of claim 2, 4, or 5 wherein the reduction in the absorbance of the actinic radiation of the photobleachable compound in its fully photobleached state when exposed to the actinic radiation is at least 43%.

7. A photopolymerizable composition, comprising: at least one elastomeric binder, at least one monomer, an initiator having sensitivity to actinic radiation, and at least one photobleachable compound having sensitivity to actinic radiation, wherein said photobleachable compound is thermally stable and when exposed to the actinic radiation changes to a photobleached state and exhibits at least a 43% reduction in absorbance of the actinic radiation at which polymerization proceeds in areas exposed to the actinic radiation when in a fully photobleached state, said photobleachable compound retaining absorption of the actinic radiation in areas not exposed to the actinic radiation.

8. A photosensitive printing element used for preparing flexographic printing plates, comprising:
a support; and
a photopolymerizable layer comprising the photopolymerizable composition of claim 7.

9. A photopolymerizable composition, comprising: at least one elastomeric binder, at least one monomer, an initiator having sensitivity to actinic radiation, and at least one photobleachable compound having sensitivity to actinic radiation, wherein said photobleachable compound is thermally stable and when exposed to the actinic radiation changes to a photobleached state exhibiting reduction in absorbance of the actinic radiation at which polymerization proceeds in areas exposed to the actinic radiation, said photobleachable compound retaining absorption of the actinic radiation in areas not exposed to the actinic radiation, and wherein the photobleachable compound is selected from the group consisting of an unsubstituted or a substituted naphthylvinyl pyridine; an unsubstituted or a substituted styrylquinoline; a diphenyl maleic anhydride; isomers of any of the foregoing; derivatives of any of the foregoing; and any combination of the foregoing.

10. The photopolymerizable composition of claim 9 wherein the amount of photobleachable compound in the photopolymerizable composition ranges from about 0.001 to about 10% by weight.

11. The photopolymerizable composition of claim 10 wherein the amount of photobleachable compound ranges from about 0.01 to about 5% by weight.

12. The photopolymerizable composition of claim 11 wherein the amount of photobleachable compound ranges from about 0.02 to about 2% by weight.

13. The photopolymerizable composition of claim 9 wherein the elastomeric binder is a styrene-butadiene-styrene block copolymer or a styrene-isoprene-styrene block copolymer.

14. A photosensitive printing element used for preparing flexographic printing plates, comprising:
a support; and
a photopolymerizable layer comprising the photopolymerizable composition of claim 9.

15. The photosensitive printing element of claim 14 wherein the amount of photobleachable compound in the photopolymerizable layer ranges from about 0.001% to about 10% by weight.

16. The photosensitive printing element of claim 15 wherein the amount of photobleachable compound ranges from about 0.01 to about 5% by weight.

17. The photosensitive printing element of claim 16 wherein the amount of photobleachable compound ranges from about 0.02 to about 2% by weight.

18. The photosensitive printing element of claim 14 wherein the photopolymerizable layer is of a single layer construction.

19. The photosensitive printing element of claim 14 wherein the photopolymerizable layer is of a bi- or a multi-layer construction.

20. The photosensitive printing element of claim 19 wherein at least one layer of the photopolymerizable layer includes the photobleachable compound.

21. The photosensitive printing element of claim 20 wherein at least two layers include the photobleachable compound, each of the said two layers including a different weight percent of the photobleachable compound.

22. The photosensitive printing element of claim 19 wherein the photobleachable compound is covalently attached to a polymer or oligomer.

23. The photosensitive printing element of claim 22 wherein the polymer or oligomer is selected from the group consisting of a polyvinylalcohol, poly(methylmethacrylate), poly(ethyl methacrylate), polystyrene, polyamide, polyester, polysiocyanatoethylmethyl methacrylate, a copolymer of isocyanatoethylmethyl methyacrylate and methyl methacrylate, and a copolymer of isocyanatoethylmethyl methylacrylate and dimethylaminoethyl methacrylate.

24. The photosensitive printing element of claim 14 further comprising at least one additional layer selected from the group consisting of a barrier layer, an infrared-sensitive layer, and combinations thereof.

25. The photosensitive printing element of claim 24 wherein the at least one additional layer is the infrared-sensitive layer, and wherein a binder in said infrared-sensitive layer is incompatible with at least one migratory material in the photopolymerizable layer.

26. The photosensitive printing element of claim 24 wherein the at least one additional layer is the infrared-sensitive layer and the barrier layer, said barrier layer being disposed between the photopolymerizable layer and the infrared-sensitive layer.

27. The photosensitive printing element of claim 14 wherein the thickness of the photopolymerizable layer ranges from about 0.005 to about 0.250 inches.

28. The photosensitive printing element of claim 27 wherein the thickness of the photopolymerizable layer ranges from about 0.010 to about 0.067 inches.

29. The photosensitive printing element of claim 14 wherein the initiator is photobleachable.

30. The photosensitive printing element of claim 14 wherein the reduction in the absorbance of the actinic radiation of the photobleachable compound in its fully photobleached state when exposed to the actinic radiation is at least 43%.

31. The photopolymerizable composition of claim 9 wherein the photobleachable compound is the unsubstituted or the substitued naphthylvinyl pyridine selected from the group consisting of 4-(1-naphthylvinyl)-pyridine; 4-(2-naphthylvinyl)-pyridine; 3-(1-naphthylvinyl)-pyridine; 3-(2-naphthylvinyl)-pyridine; 2-(1-naphthylvinyl)-pyridine; and 2-(2-naphthylvinyl)-pyridine.

32. The photopolymerizable composition of claim 9 wherein the photobleachable compound is the unsubstituted or the substituted styrylquinoline selected from the group consisting of 4-styrylquinoline, 2-styrylquinoline, 3-styrylisoquinoline, 4-styrylisoquinoline, 1-styrylisoquinoline, and 3-styrylquinoline.

33. The photopolymerizable composition of claim 9 wherein the photobleachable compound is the diphenyl maleic anhydride selected from the group consisting of unsubstituted diphenyl maleic anhydride and diphenyl maleic anhydride substituted with one or more independently selected halogen atoms, one or more alkyl groups each independently containing 1 to 10 carbon atoms, and one or more alkoxy groups each independently having 1 to 10 carbon atoms.

34. A method for making a flexographic printing plate comprising:

(a) imagewise exposing a photopolymerizable printing element having a layer of a composition to actinic radiation to selectively polymerize portions of the layer, said composition comprising at least one elastomeric binder, at least one monomer, an initiator having sensitivity to actinic radiation, and at least one photobleachable compound having sensitivity to the actinic radiation, wherein said photobleachable compound is thermally stable and when exposed to the actinic radiation changes to a photobleached state and exhibits at least a 43% reduction in absorbance of the actinic radiation at which polymerization proceeds in areas exposed to the actinic radiation when in a filly photobleached state, said photobleachable compound retaining absorption of the actinic radiation in areas not exposed to the actinic radiation; and (b) treating the element resulting from step (a) to remove unpolymerized portions of the layer to form the flexographic printing plate.

* * * * *

UNITED STATES PATENT AND TRADEMARK OFFICE
CERTIFICATE OF CORRECTION

PATENT NO. : 6,864,039 B2
DATED : March 8, 2005
INVENTOR(S) : Cheng Lap Kin and Cheng Lap-Tak Andrew It is certified that error appears in the above-identified patent and that said Letters Patent is hereby corrected as shown below:

Column 25,
Line 63, "foregoing derivatives" should read -- foregoing, derivatives --.

Column 28,
Line 3, "substitued" should read -- substituted --.

Signed and Sealed this

Fifteenth Day of November, 2005

JON W. DUDAS
*Director of the United States Patent and Trademark Office*